US012587149B2

(12) United States Patent
Datta et al.

(10) Patent No.: US 12,587,149 B2
(45) Date of Patent: Mar. 24, 2026

(54) STABILITY IN POWER AMPLIFIERS UNDER HIGH IN-BAND VOLTAGE STANDING WAVE RATIO CONDITION

(71) Applicant: SKYWORKS SOLUTIONS, INC., Irvine, CA (US)

(72) Inventors: Kunal Datta, Sunnyvale, CA (US); Khaled A. Fayed, Marion, IA (US); Edward James Anthony, Robins, IA (US); Srivatsan Jayaraman, Santa Clara, CA (US)

(73) Assignee: Skyworks Solutions, Inc., Irvine, CA (US)

( * ) Notice: Subject to any disclaimer, the term of this patent is extended or adjusted under 35 U.S.C. 154(b) by 920 days.

(21) Appl. No.: 17/842,633

(22) Filed: Jun. 16, 2022

(65) Prior Publication Data

US 2023/0006622 A1     Jan. 5, 2023

Related U.S. Application Data

(60) Provisional application No. 63/212,030, filed on Jun. 17, 2021.

(51) Int. Cl.
*H03F 3/24*     (2006.01)
*H03F 1/56*     (2006.01)
*H03F 3/195*     (2006.01)
*H04B 1/04*     (2006.01)

(52) U.S. Cl.
CPC ............... *H03F 3/245* (2013.01); *H03F 1/56* (2013.01); *H03F 1/565* (2013.01); *H03F 3/195* (2013.01); *H04B 1/0458* (2013.01); *H03F 2200/387* (2013.01); *H03F 2200/451* (2013.01); *H04B 2001/0408* (2013.01)

(58) Field of Classification Search
CPC ...... H03F 3/245; H03F 1/56; H03F 2200/387; H04B 2001/0408
See application file for complete search history.

(56) References Cited

U.S. PATENT DOCUMENTS 5,406,226 A * 4/1995 Cioffi ........................ H03F 1/34
                                                                  330/306
2006/0197594 A1* 9/2006 Scuderi .................... H03F 1/52
                                                                  330/127

* cited by examiner

*Primary Examiner* — Andrea Lindgren Baltzell
*Assistant Examiner* — Malane Lieng
(74) *Attorney, Agent, or Firm* — Chang & Hale LLP

(57) ABSTRACT

In some embodiments, stability in power amplifiers can be achieved under high in-band voltage standing wave ratio condition, with an amplifier circuit that includes an amplifier having a first stage and a second stage, with each stage including an input and an output, such that the output of the first stage is coupled to the input of the second stage. The amplifier circuit further includes a stabilizing circuit implemented on the input side of the second stage and configured to provide stability in operation of the amplifier under a high in-band voltage standing wave ratio condition.

16 Claims, 17 Drawing Sheets

100

POWER AMPLIFIER (PA) CIRCUIT

102   PA

104   VSWR MANAGEMENT CIRCUIT(S)

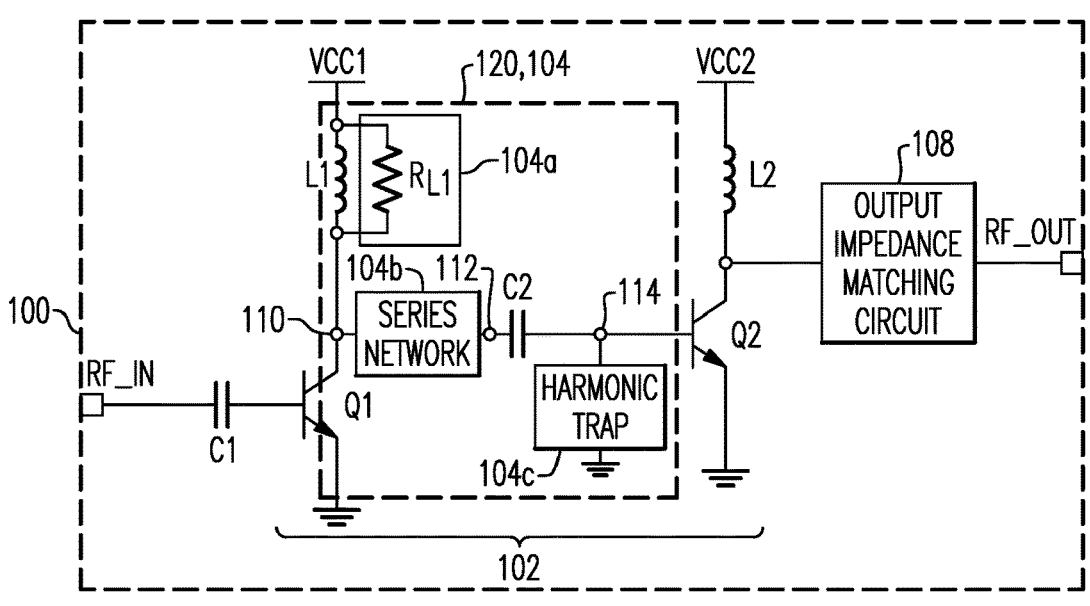
FIG.9
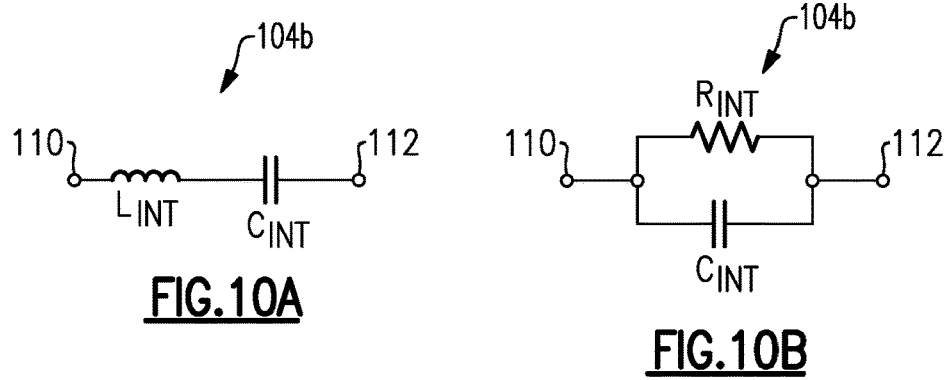
FIG.10A
FIG.10B
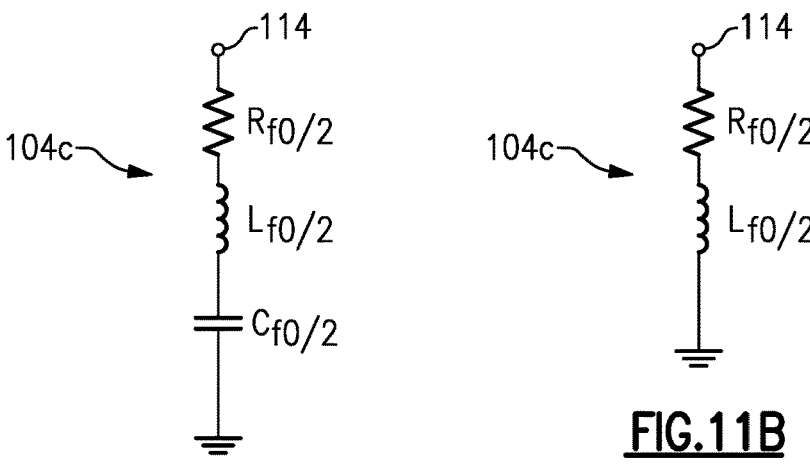
FIG.11A
FIG.11B

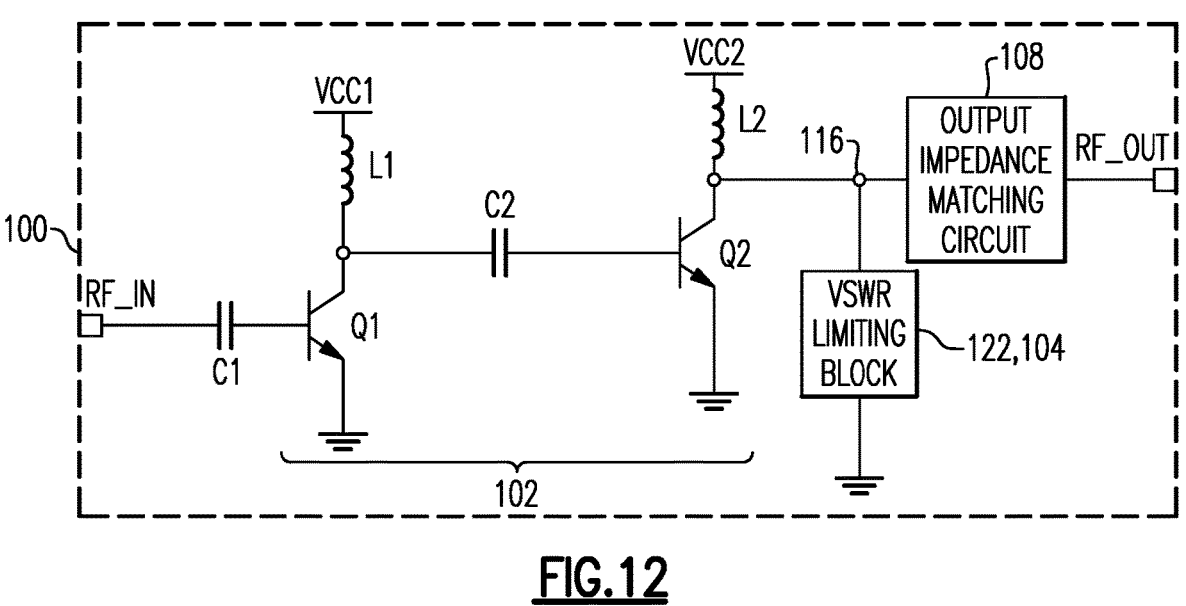
FIG.12
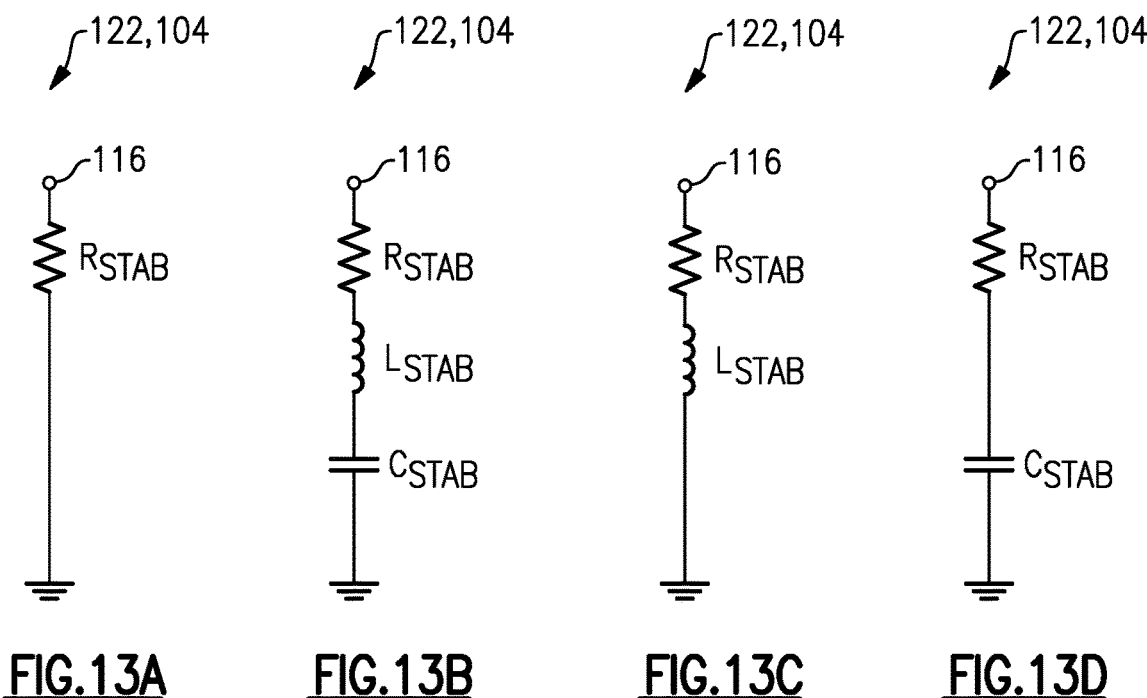
FIG.13A          FIG.13B          FIG.13C          FIG.13D

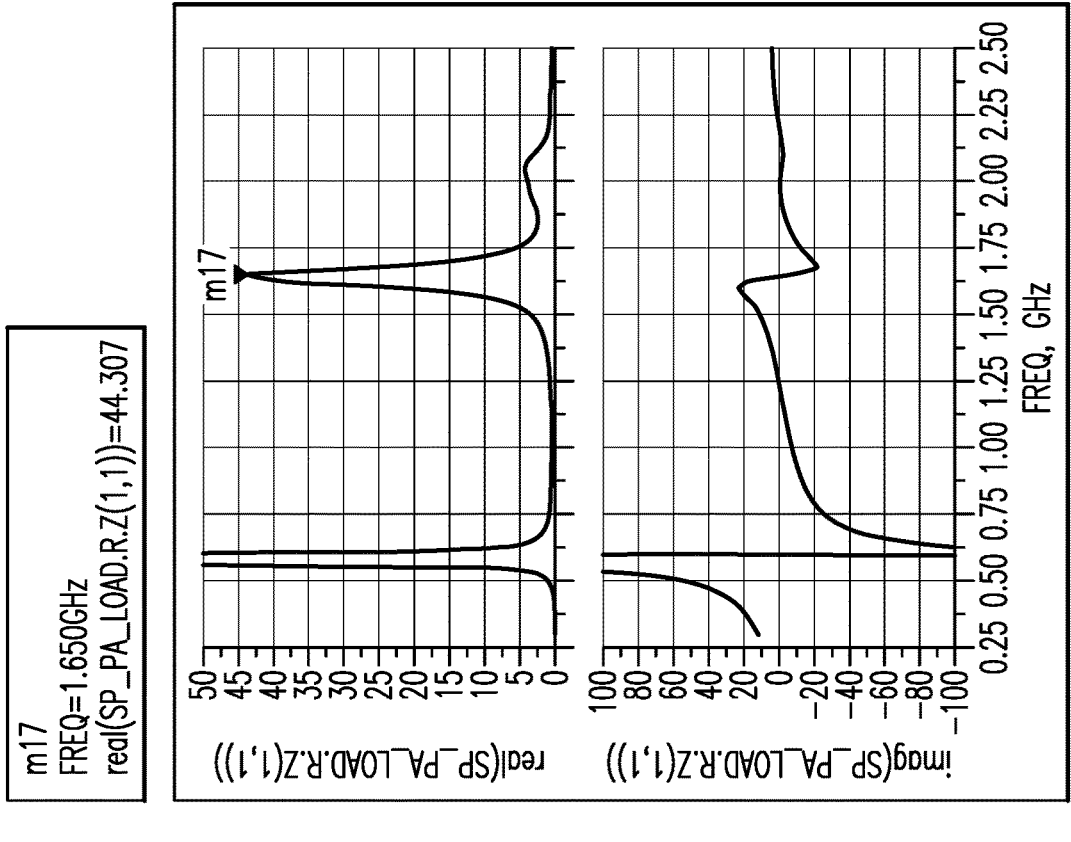
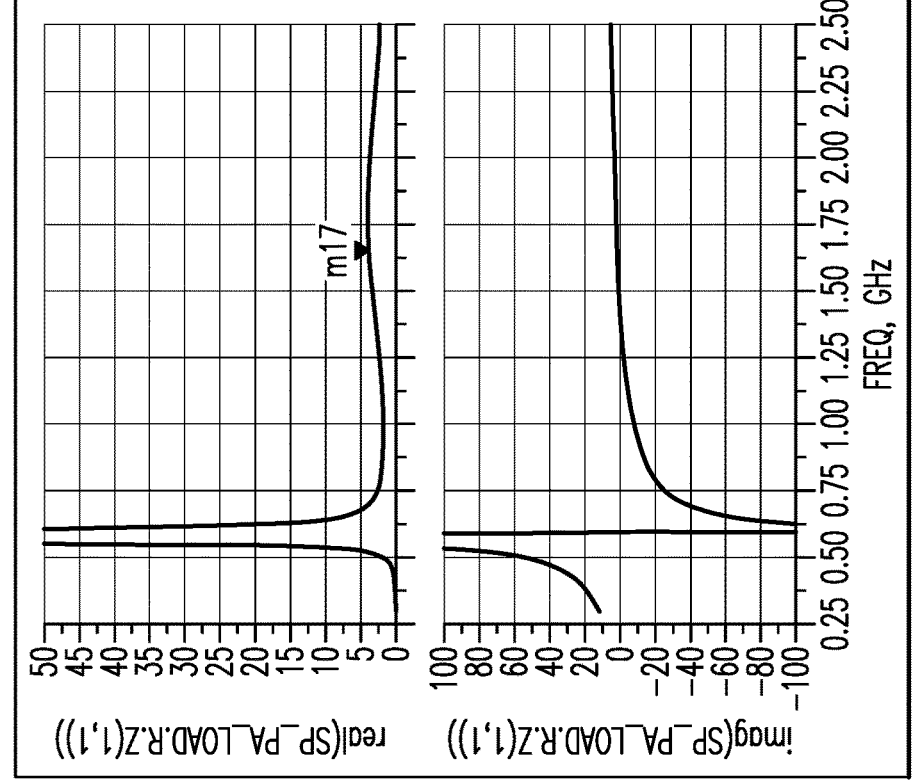
FIG.17

STABILITY IN POWER AMPLIFIERS UNDER HIGH IN-BAND VOLTAGE STANDING WAVE RATIO CONDITION

CROSS-REFERENCE TO RELATED APPLICATION(S)

This application claims priority to U.S. Provisional Application No. 63/212,030 filed Jun. 17, 2021, entitled STABILITY TECHNIQUES IN POWER AMPLIFIERS UNDER HIGH VSWR CONDITIONS, the disclosure of which is hereby expressly incorporated by reference herein in its respective entirety.

BACKGROUND

Field

The present disclosure relates to power amplifiers for radio-frequency applications.

Description of the Related Art

In radio-frequency (RF) applications, a signal to be transmitted is typically amplified by a power amplifier. Such a transmission of the amplified signal occurs through an antenna. In such a transmission configuration, there may be an undesirable mismatch in a load impedance presented to the power amplifier.

SUMMARY

In accordance with some implementations, the present disclosure relates to an amplifier circuit that includes an amplifier having a first stage and a second stage, with each stage including an input and an output, such that the output of the first stage is coupled to the input of the second stage. The amplifier circuit further includes a stabilizing circuit implemented on the input side of the second stage and configured to provide stability in operation of the amplifier under a high in-band voltage standing wave ratio condition.

In some embodiments, the second stage can be an output stage of a plurality of stages of the amplifier. The first stage can be a stage immediately preceding the output stage.

In some embodiments, first stage can include a first amplifier transistor, and the second stage can include a second amplifier transistor, such that the output of the first amplifier transistor is coupled to the input of the second amplifier transistor. Each of the first and second amplifier transistors can be implemented as a bipolar-junction transistor having a base as the input and a collector as the output.

In some embodiments, the stabilizing circuit can include one or more of a harmonic trap coupled to the base of the second amplifier transistor, a spur-reduction network implemented between the first and second amplifier transistors, and a resistance implemented to be electrically parallel with a choke inductance that couples the collector of the first amplifier transistor to a supply voltage node. The harmonic trap can be configured to reduce generation of one or more oscillatory spurs at one or more harmonic frequencies. The one or more harmonic frequencies can include one or more half-harmonic frequencies.

In some embodiments, the harmonic trap can include a half-harmonic notch circuit having a resistance, an inductance, and a capacitance arranged in electrical series between the base of the second amplifier transistor and ground. In some embodiments, the harmonic trap can include a resistance and an inductance arranged in electrical series between the base of the second amplifier transistor and ground. The resistance and the inductance can be selected to provide a low-frequency short functionality.

In some embodiments, the spur-reduction network can be configured to reduce gain of one or more low-frequency spurs. In some embodiments, the spur-reduction network can include an inductance and a capacitance arranged in electrical series between the collector of the first amplifier transistor and an inter-stage DC-block capacitance, with the inductance and the capacitance being selected to provide a band-pass functionality. In some embodiments, the spur-reduction network can include a resistance and a capacitance arranged to be electrically parallel between the collector of the first amplifier transistor and an inter-stage DC-block capacitance, with the inductance and the capacitance being selected to provide a high-pass functionality.

In some embodiments, the resistance can be selected to reduce an inter-stage loop gain for one or more harmonics and one or more low-frequency spurs.

In some embodiments, the amplifier can be a power amplifier.

In some implementations, the present disclosure relates to a semiconductor die that includes a semiconductor substrate and an amplifier circuit implemented on the semiconductor substrate. The amplifier circuit includes an amplifier having a first stage and a second stage, with each stage including an input and an output, such that the output of the first stage is coupled to the input of the second stage. The amplifier circuit further includes a stabilizing circuit implemented on the input side of the second stage and configured to provide stability in operation of the amplifier under a high in-band voltage standing wave ratio condition.

In some embodiments, the amplifier can be a power amplifier.

In a number of teachings, the present disclosure relates to a packaged module that includes a packaging substrate configured to receive a plurality of components, and an amplifier circuit implemented on the packaging substrate. The amplifier circuit includes an amplifier having a first stage and a second stage, with each stage including an input and an output, such that the output of the first stage is coupled to the input of the second stage. The amplifier circuit further includes a stabilizing circuit implemented on the input side of the second stage and configured to provide stability in operation of the amplifier under a high in-band voltage standing wave ratio condition.

In some embodiments, the amplifier can be a power amplifier. In some embodiments, the packaged module can be a power amplifier module. In some embodiments, packaged module is a front-end module.

In some embodiments, the package module can further include an output impedance matching network coupled to the output of the second stage.

In some implementations, the present disclosure relates to a wireless device that includes a transceiver and an amplifier circuit configured to process a signal associated with the transceiver. The amplifier circuit includes an amplifier having a first stage and a second stage, with each stage including an input and an output, such that the output of the first stage is coupled to the input of the second stage. The amplifier circuit further includes a stabilizing circuit implemented on the input side of the second stage and configured to provide stability in operation of the amplifier under a high in-band voltage standing wave ratio condition. The wireless device further includes an antenna in communication with the amplifier circuit and configured to support operation of the wireless device with the signal.

In some embodiments, the amplifier can be a power amplifier, and the signal can be a transmit signal for transmission by the antenna. In some embodiments, the amplifier circuit can be implemented on a packaged module that also includes an output impedance matching network coupled to the output of the second stage.

In some embodiments, the wireless device can further include a matching circuit implemented off of the packaged module and to be electrically between the output impedance matching network of the packaged module and the antenna.

In some embodiments, the wireless device can be a cellular phone.

According to some implementations, the present disclosure relates to an amplifier circuit that includes an amplifier having a first stage and a second stage, with each stage including an input and an output, such that the output of the first stage is coupled to the input of the second stage. The amplifier circuit further includes a stabilizing circuit implemented on the output side of the second stage and configured to provide stability in operation of the amplifier under a high out-of-band voltage standing wave ratio condition.

In some embodiments, the second stage can be an output stage of a plurality of stages of the amplifier. The first stage can be a stage immediately preceding the output stage.

In some embodiments, the first stage can include a first amplifier transistor, and the second stage can include a second amplifier transistor, such that the output of the first amplifier transistor is coupled to the input of the second amplifier transistor. Each of the first and second amplifier transistors can be implemented as a bipolar-junction transistor having a base as the input and a collector as the output.

In some embodiments, the stabilizing circuit can include a limiting circuit implemented between the collector of the second amplifier transistor and ground. The limiting circuit can be configured to reduce generation of one or more oscillatory spurs under the high out-of-band voltage standing wave ratio condition.

In some embodiments, the limiting circuit can include a resistance implemented between the collector of the second amplifier transistor and ground. The resistance can be selected to limit voltage standing wave ratio across substantially the entire frequency range associated with operation of the power amplifier.

In some embodiments, the limiting circuit can include a resistance, an inductance, and a capacitance arranged in electrical series between the collector of the second amplifier transistor and ground. The resistance, the inductance, and the capacitance can be selected to provide a notch functionality to limit voltage standing wave ratio at an out-of-band spur frequency.

In some embodiments, the limiting circuit can include a resistance and an inductance arranged in electrical series between the collector of the second amplifier transistor and ground. The resistance and the inductance can be selected to provide a low-pass functionality to limit voltage standing wave ratio for frequencies below a transmit in-band frequency.

In some embodiments, the limiting circuit can include a resistance and a capacitance arranged in electrical series between the collector of the second amplifier transistor and ground. The resistance and the capacitance can be selected to provide a high-pass functionality to limit voltage standing wave ratio for frequencies above a transmit in-band frequency.

In some embodiments, the amplifier can be a power amplifier.

In a number of implementations, the present disclosure relates to a semiconductor die that includes a semiconductor substrate and an amplifier circuit implemented on the semiconductor substrate. The amplifier circuit includes an amplifier having a first stage and a second stage, with each stage including an input and an output, such that the output of the first stage is coupled to the input of the second stage. The amplifier circuit further includes a stabilizing circuit implemented on the output side of the second stage and configured to provide stability in operation of the amplifier under a high out-of-band voltage standing wave ratio condition.

In some embodiments, the amplifier can be a power amplifier.

In a number of implementations, the present disclosure relates to a packaged module that includes a packaging substrate configured to receive a plurality of components and an amplifier circuit implemented on the packaging substrate. The amplifier circuit includes an amplifier having a first stage and a second stage, with each stage including an input and an output, such that the output of the first stage is coupled to the input of the second stage. The amplifier circuit further includes a stabilizing circuit implemented on the output side of the second stage and configured to provide stability in operation of the amplifier under a high out-of-band voltage standing wave ratio condition.

In some embodiments, the amplifier can be a power amplifier. In some embodiments, the packaged module can be a power amplifier module. In some embodiments, the packaged module can be a front-end module.

In some embodiments, the packaged module can further include an output impedance matching network coupled to the output of the second stage.

In some teachings, the present disclosure relates to a wireless device that includes a transceiver and an amplifier circuit configured to process a signal associated with the transceiver. The amplifier circuit includes an amplifier having a first stage and a second stage, with each stage including an input and an output, such that the output of the first stage is coupled to the input of the second stage. The amplifier circuit further includes a stabilizing circuit implemented on the output side of the second stage and configured to provide stability in operation of the amplifier under a high out-of-band voltage standing wave ratio condition. The wireless device further includes an antenna in communication with the amplifier circuit and configured to support operation of the wireless device with the signal.

In some embodiments, the amplifier can be a power amplifier, and the signal can be a transmit signal for transmission by the antenna.

In some embodiments, the amplifier circuit can be implemented on a packaged module that also includes an output impedance matching network coupled to the output of the second stage. In some embodiments, the wireless device can further include a filter configured to support an in-band frequency operation of the power amplifier, and implemented to be electrically between the output impedance matching network of the packaged module and the antenna.

In some embodiments, the wireless device can be a cellular phone.

In accordance with some implementations, the present disclosure relates to an amplifier circuit that includes an amplifier having a selected stage among a plurality of stages, and either or both of a first stabilizing circuit implemented on an input side of the selected stage to provide stability in operation of the amplifier under a high in-band voltage standing wave ratio condition, and a second stabilizing circuit implemented on an output side of the selected stage to provide stability in operation of the amplifier under a high out-of-band voltage standing wave ratio condition.

In some embodiments, the selected stage can be an output stage of the plurality of stages each having a respective amplifier transistor. The output stage can be configured such that an output of the amplifier transistor of a preceding stage is coupled to an input of the amplifier transistor of the output stage.

In some embodiments, the amplifier transistor of the output stage can be implemented as a bipolar-junction transistor having a base as an input and a collector as an output.

In some embodiments, the first stabilizing circuit can include one or more of a harmonic trap coupled to the base of the amplifier transistor of the output stage, a spur-reduction network implemented between the amplifier transistors of the output and preceding stages, and a resistance implemented to be electrically parallel with a choke inductance that couples the collector of the amplifier transistor of the preceding stage to a supply voltage node.

In some embodiments, the harmonic trap can include a half-harmonic notch circuit having a resistance, an inductance, and a capacitance arranged in electrical series between the base of the amplifier transistor of the output stage and ground. In some embodiments, the harmonic trap can include a resistance and an inductance arranged in electrical series between the base of the amplifier transistor of the output stage and ground, with the resistance and the inductance being selected to provide a low-frequency short functionality.

In some embodiments, the spur-reduction network can include an inductance and a capacitance arranged in electrical series between the collector of the amplifier transistor of the preceding stage and an inter-stage DC-block capacitance, with the inductance and the capacitance being selected to provide a band-pass functionality. In some embodiments, the spur-reduction network can include a resistance and a capacitance arranged to be electrically parallel between the collector of the amplifier transistor of the preceding stage and an inter-stage DC-block capacitance, with the inductance and the capacitance being selected to provide a high-pass functionality.

In some embodiments, the resistance can be selected to reduce an inter-stage loop gain for one or more harmonics and one or more low-frequency spurs.

In some embodiments, the second stabilizing circuit can include a limiting circuit implemented between the collector of the amplifier transistor of the output stage and ground. The limiting circuit can be configured to reduce generation of one or more oscillatory spurs under the high out-of-band voltage standing wave ratio condition.

In some embodiments, the limiting circuit can include a resistance implemented between the collector of the amplifier transistor of the output stage and ground, with the resistance being selected to limit voltage standing wave ratio across substantially the entire frequency range associated with operation of the amplifier. In some embodiments, the limiting circuit can include a resistance, an inductance, and a capacitance arranged in electrical series between the collector of the amplifier transistor of the output stage and ground, with the resistance, the inductance, and the capacitance being selected to provide a notch functionality to limit voltage standing wave ratio at an out-of-band spur frequency. In some embodiments, the limiting circuit can include a resistance, and an inductance arranged in electrical series between the collector of the amplifier transistor of the output stage and ground, with the resistance and the inductance being selected to provide a low-pass functionality to limit voltage standing wave ratio for frequencies below a transmit in-band frequency. In some embodiments, the limiting circuit can include a resistance and a capacitance arranged in electrical series between the collector of the amplifier transistor of the output stage and ground, with the resistance and the capacitance being selected to provide a high-pass functionality to limit voltage standing wave ratio for frequencies above a transmit in-band frequency.

In some implementations, the present disclosure relates to a semiconductor die that includes a semiconductor substrate and an amplifier circuit implemented on the semiconductor substrate. The amplifier circuit includes an amplifier having a selected stage among a plurality of stages. The amplifier circuit further includes either or both of a first stabilizing circuit implemented on an input side of the selected stage to provide stability in operation of the amplifier under a high in-band voltage standing wave ratio condition, and a second stabilizing circuit implemented on an output side of the selected stage to provide stability in operation of the amplifier under a high out-of-band voltage standing wave ratio condition.

In some implementations, the present disclosure relates to a packaged module that includes a packaging substrate configured to receive a plurality of components and an amplifier circuit implemented on the packaging substrate. The amplifier circuit includes an amplifier having a selected stage among a plurality of stages. The amplifier circuit further includes either or both of a first stabilizing circuit implemented on an input side of the selected stage to provide stability in operation of the amplifier under a high in-band voltage standing wave ratio condition, and a second stabilizing circuit implemented on an output side of the selected stage to provide stability in operation of the amplifier under a high out-of-band voltage standing wave ratio condition.

In some implementations, the present disclosure relates to a wireless device that includes a transceiver and an amplifier circuit configured to process a signal associated with the transceiver. The amplifier circuit includes an amplifier having a selected stage among a plurality of stages. The amplifier circuit further includes either or both of a first stabilizing circuit implemented on an input side of the selected stage to provide stability in operation of the amplifier under a high in-band voltage standing wave ratio condition, and a second stabilizing circuit implemented on an output side of the selected stage to provide stability in operation of the amplifier under a high out-of-band voltage standing wave ratio condition. The wireless device further includes an antenna in communication with the amplifier circuit and configured to support operation of the wireless device with the signal.

For purposes of summarizing the disclosure, certain aspects, advantages and novel features of the inventions have been described herein. It is to be understood that not necessarily all such advantages may be achieved in accordance with any particular embodiment of the invention. Thus, the invention may be embodied or carried out in a manner that achieves or optimizes one advantage or group of advantages as taught herein without necessarily achieving other advantages as may be taught or suggested herein.

The present disclosure relates to U.S. patent application Ser. No. 17/842,634, titled "STABILITY IN POWER AMPLIFIERS UNDER HIGH OUT-OF-BAND VOLTAGE STANDING WAVE RATIO CONDITION," and U.S. patent application Ser. No. 17/842,636, titled "STABILITY TECH- NIQUES IN POWER AMPLIFIERS UNDER HIGH VOLT-
AGE STANDING WAVE RATIO CONDITIONS," each
filed on even date herewith and each hereby incorporated by
reference herein in its entirety.

BRIEF DESCRIPTION OF THE DRAWINGS

FIG. 9 shows a power amplifier circuit that is a more
specific example of the power amplifier circuit of FIG. 6.

FIG. 10A shows an example of a series network that can
be implemented in the power amplifier circuit of FIG. 9.

FIG. 10B shows another example of a series network that
can be implemented in the power amplifier circuit of FIG. 9.

FIG. 11A shows an example of a harmonic trap that can
be implemented in the power amplifier circuit of FIG. 9.

FIG. 11B shows another example of a harmonic trap that
can be implemented in the power amplifier circuit of FIG. 9.

FIG. 12 shows a power amplifier circuit that is a more
specific example of the power amplifier circuit of FIG. 7.

FIG. 13A shows an example of a VSWR limiting circuit
that can be implemented in the power amplifier circuit of
FIG. 12.

FIG. 13B shows another example of a VSWR limiting
circuit that can be implemented in the power amplifier
circuit of FIG. 12.

FIG. 13C shows yet another example of a VSWR limiting
circuit that can be implemented in the power amplifier
circuit of FIG. 12.

FIG. 13D shows yet another example of a VSWR limiting
circuit that can be implemented in the power amplifier
circuit of FIG. 12.

FIG. 17 shows impedance plots of a load seen by the
power amplifier of FIG. 15 under a 50-Ohm load condition,
and impedance plots of a load seen by the power amplifier
under a high out-of-band VSWR condition.

DETAILED DESCRIPTION OF SOME EMBODIMENTS

The headings provided herein, if any, are for convenience
only and do not necessarily affect the scope or meaning of
the claimed invention.

In many implementations of power amplifiers in wireless
devices such as cellular phones, a power amplifier module
being mounted on a phone-board often results in a load
impedance presented to the power amplifier being quite
different from a desired impedance (e.g. 50 Ohm). Such an
impedance mismatch results in the power amplifier operat-
ing under a high voltage standing wave ratio (VSWR)
condition (e.g., high in-band VSWR), Such a high in-band
VSWR condition often causes the power amplifier to oscil-
late, resulting in non-functionality or reduced-functionality
of the power amplifier module.

Similarly, when a power amplifier is integrated in a front-end module with other components such as a filter and/or a duplexer, an out-of-band impedance (e.g., an impedance presented to the power amplifier outside of the corresponding frequency range) cannot be controlled accurately, or is difficult to control accurately. Such a situation leads to a high out-of-band VSWR being presented to the power amplifier, and the resulting high VSWR condition can cause the power amplifier to oscillate.

In some techniques, improvement of in-band stability of power amplifier modules often involves adding more resistive loss in a radio-frequency (RF) signal path. Such a configuration typically leads to degraded collector efficiency in power amplifiers and increased DC power consumption. Other solutions include changing the values of bypass capacitors which can degrade memory effects in power amplifiers, typically resulting in reduced power capability for higher bandwidth modulations.

In some techniques, and in an example context of a two-stage power amplifier, to obtain reduction of oscillations resulting from high out-of-band VSWR conditions, both inter-stage load-line and final stage load-line need to change. Unfortunately such a configuration can also severely impact the AMAM and AMPM characteristics of wide-band linear power amplifiers resulting in decreased linear power capability.

In some implementations, the present disclosure relates to one or more circuit networks that can enable a power amplifier to operate under high in-band VSWR conditions and/or under high out-of-band VSWR conditions. In some embodiments, a power amplifier circuit having such network(s) can allow the power amplifier to operate under high in-band VSWR and/or high out-of-band VSWR conditions in a desirable manner in wireless applications such as 4G LTE and 5G designs.

Figure 1:
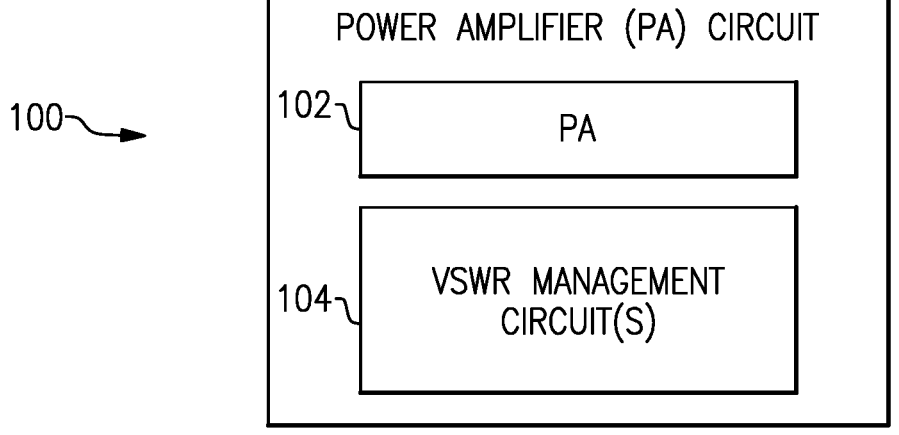
FIG. 1 depicts a power amplifier circuit that includes a
power amplifier and a voltage standing wave ratio (VSWR)
management circuit having one or more features as
described herein.

FIG. 1 depicts a power amplifier circuit 100 that includes a power amplifier 102 and a VSWR management circuit 104 having one or more features as described herein. For the purpose of description, it will be understood that the VSWR management circuit 104 can be an assembly of one or more circuits.

It is noted that various examples are described herein in the context of power amplifiers. However, it will be understood that one or more features of the present disclosure can also be implemented for other types of amplifiers.

Figure 2:
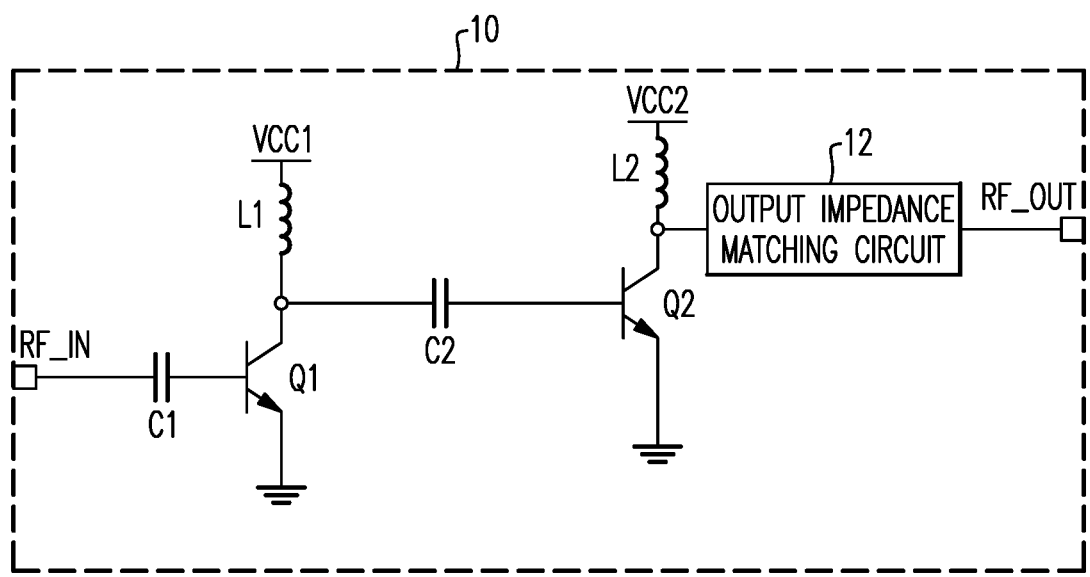
FIG. 2 shows an example of a conventional power ampli-
fier circuit configured to receive a radio-frequency (RF)
signal at an input node and provide an amplified RF signal
at an output node.

FIG. 2 shows an example of a conventional power amplifier circuit 10 configured to receive an RF signal at an input node RF_IN and provide an amplified RF signal at an output node RF_OUT. A power amplifier in such a circuit can include a first stage with a first amplifier transistor Q1 and a second stage with a second amplifier transistor Q2.

In some embodiments, each of Q1 and Q2 can be a bipolar junction transistor (BJT), and the first transistor Q1 can receive the input signal at its base (e.g., from the input node RF_IN through a DC-block capacitance C1) and generate a partially amplified signal at its collector. The partially amplified signal from the collector of Q1 can be provided to the base of Q2 (e.g., through an inter-stage DC-block capacitance C2), and Q2 can generate the amplified signal at its collector. The amplified signal from the collector of Q2 can be provided to the output node RF_OUT through an output impedance matching circuit 12.

In the example of FIG. 2, a supply voltage for the first amplifier transistor Q1 can be provided to the collector of Q1 (e.g., VCC1 through a choke inductance L1). Similarly, a supply voltage for the second amplifier transistor Q2 can be provided to the collector of Q2 (e.g., VCC2 through a choke inductance L2). The supply voltages VCC1 and VCC2 may or may not be the same. In the example of FIG. 2, although not shown, it will be understood that bias voltages can be provided to Q1 and Q2 through their respective bases.

Figure 3:
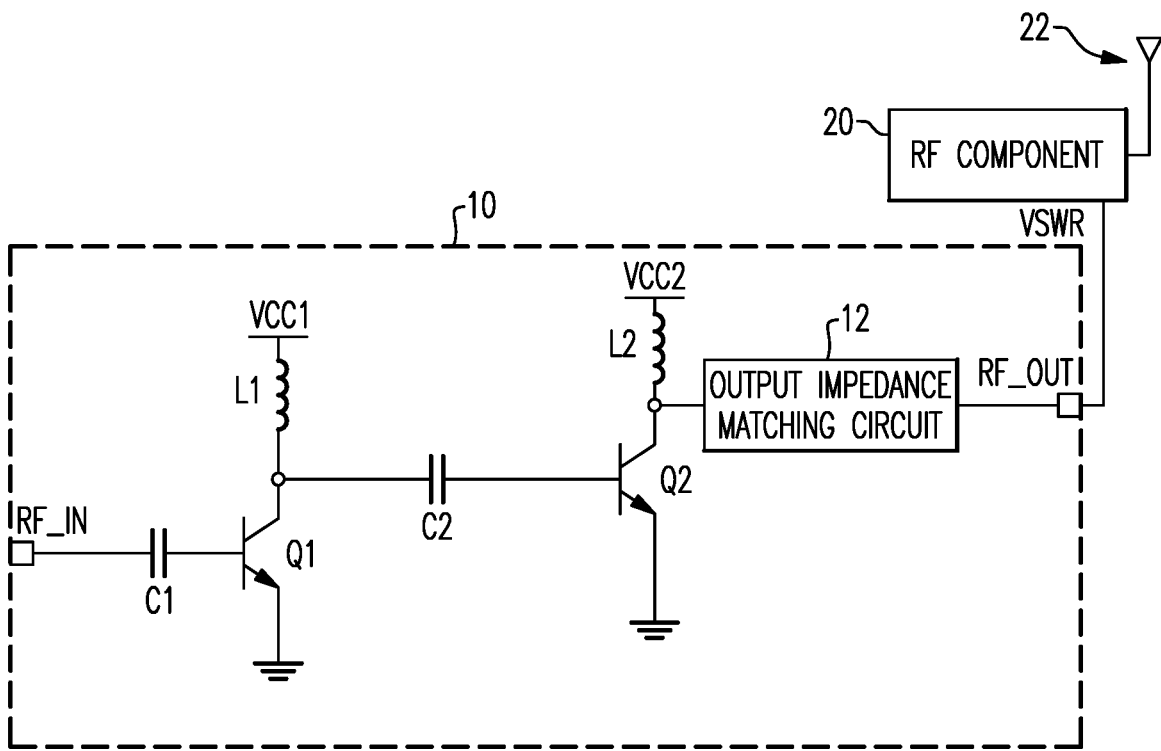
FIG. 3 shows the power amplifier circuit of FIG. 2
coupled to an antenna for transmission of the amplified
signal provided through the output node.

FIG. 3 shows the power amplifier circuit 10 of FIG. 2 coupled to an antenna 22 for transmission of the amplified signal provided through the RF_OUT node. Typically, such an amplified signal passes through an RF component 20 before being provided to the antenna.

As described herein, an impedance seen by the amplified signal (at the RF_OUT node, due to the antenna 22 and/or the RF component 20, can be significantly mismatched from a desired impedance for which the amplified signal was generated. Accordingly, a significant value of VSWR can exist between the power amplifier circuit 10 and the RF component 20.

Figure 4:
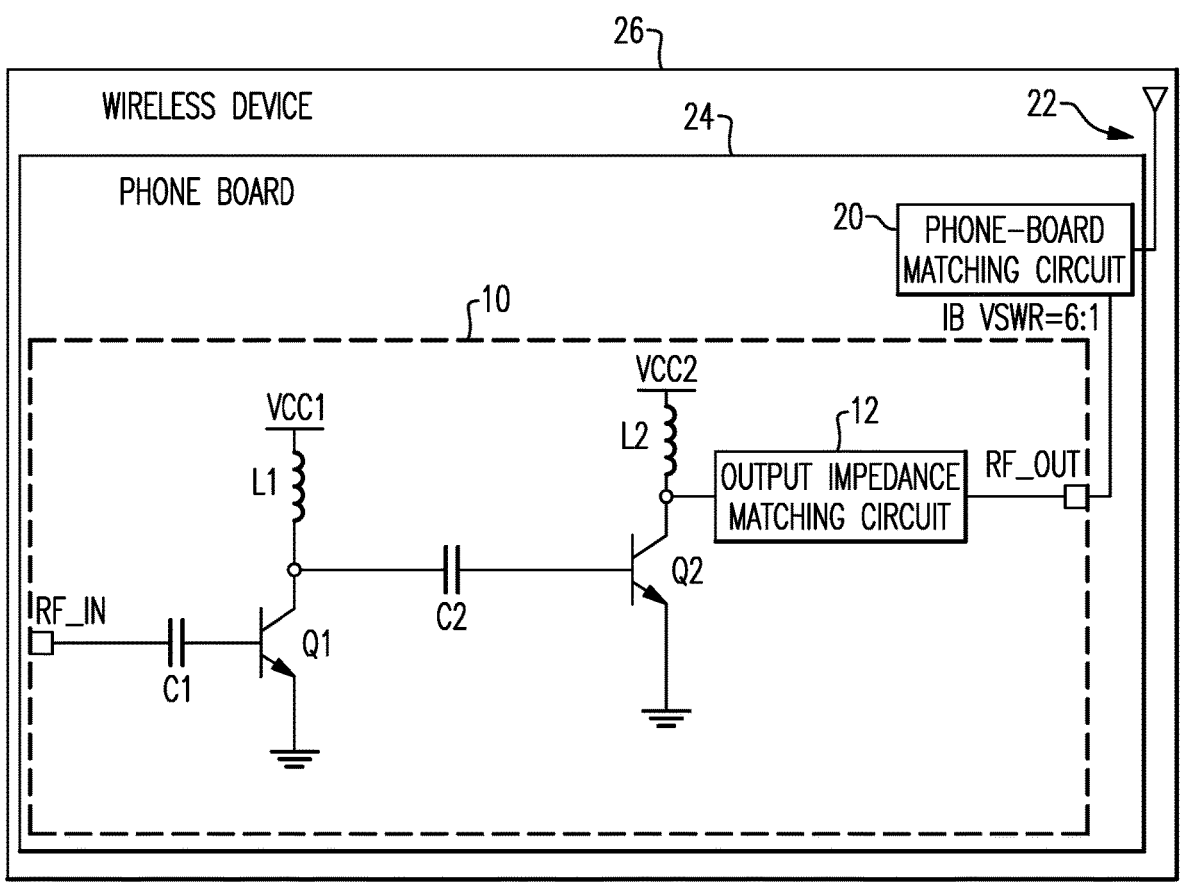
FIG. 4 shows an example where the wireless configura-
tion of FIG. 3 is implemented in a wireless device such as
a cellular phone.

For example, FIG. 4 shows the wireless configuration of FIG. 3 in a wireless device 26 such as a cellular phone. Such a wireless device may include a circuit board 24 (also referred to as a phone board) on which many of circuits and components are mounted. On such a phone board, a power amplifier circuit 10 can be provided, in the form of, for example, a semiconductor die, a packaged module, or some combination thereof. The phone board 24 also typically includes a matching circuit 20 implemented to be between the power amplifier circuit 10 and the antenna 22. In such a wireless configuration, and by way of an example, a relatively high in-band VSWR of 6:1 between the power amplifier circuit 10 and the phone board matching circuit 20 is common.

Figure 5:
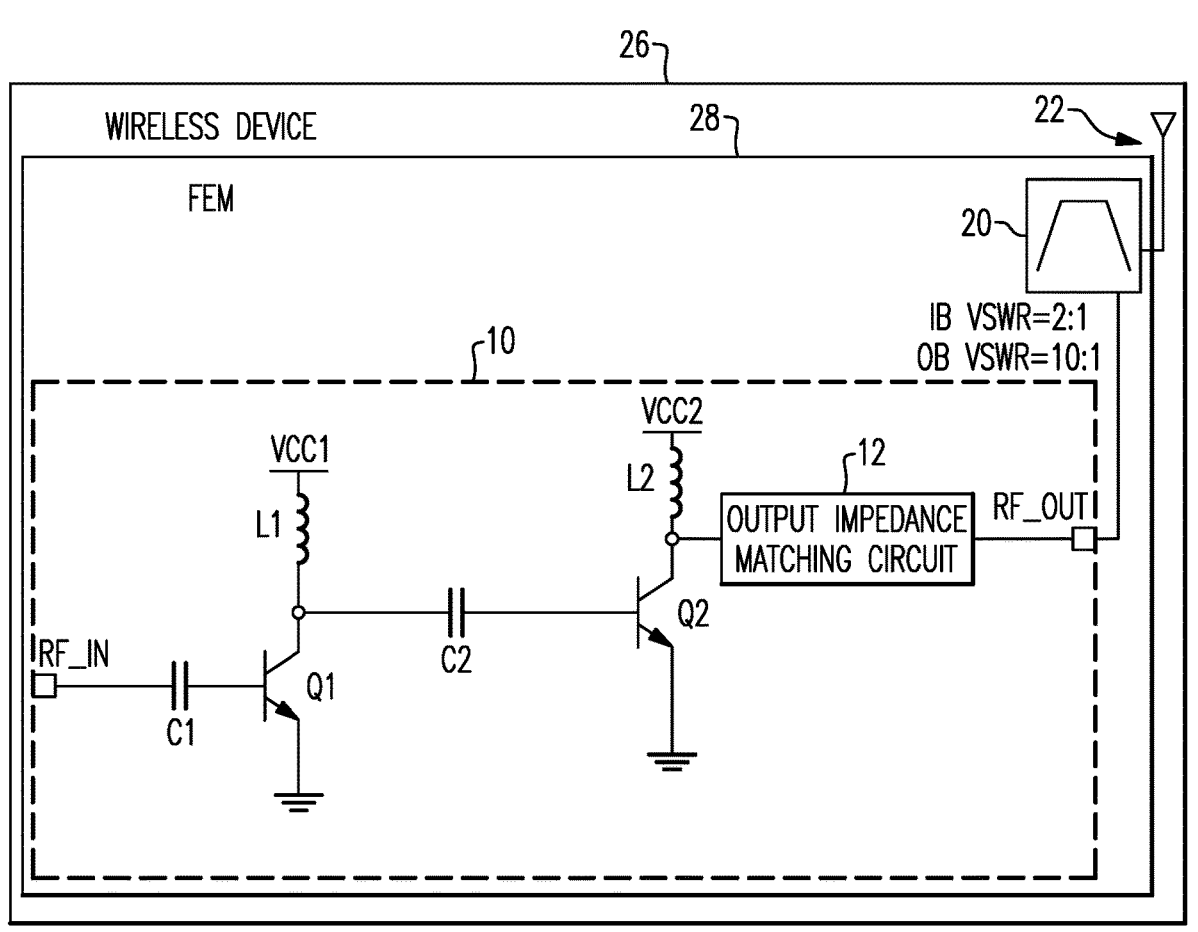
FIG. 5 shows another example where the wireless con-
figuration of FIG. 3 is implemented in a wireless device such
as a cellular phone.

In another example, FIG. 5 shows the wireless configuration of FIG. 3 in a wireless device 26 such as a cellular phone. Such a wireless device may include a front-end module (FEM) 28 (which can be mounted on a phone board). On such a front-end module, a power amplifier circuit 10 can be provided, in the form of, for example, a semiconductor die, a packaged module, or some combination thereof. The front-end module 28 also typically includes a filter 20 (e.g., a band-pass filter) implemented to be between the power amplifier circuit 10 and the antenna 22. In such a wireless configuration, and by way of an example, a desirably low in-band VSWR of 2:1 between the power amplifier circuit 10 and the filter 20 is common; however, a high out-of-band VSWR of 10:1 between the power amplifier circuit 10 and the filter 20 is also common.

Figure 6:
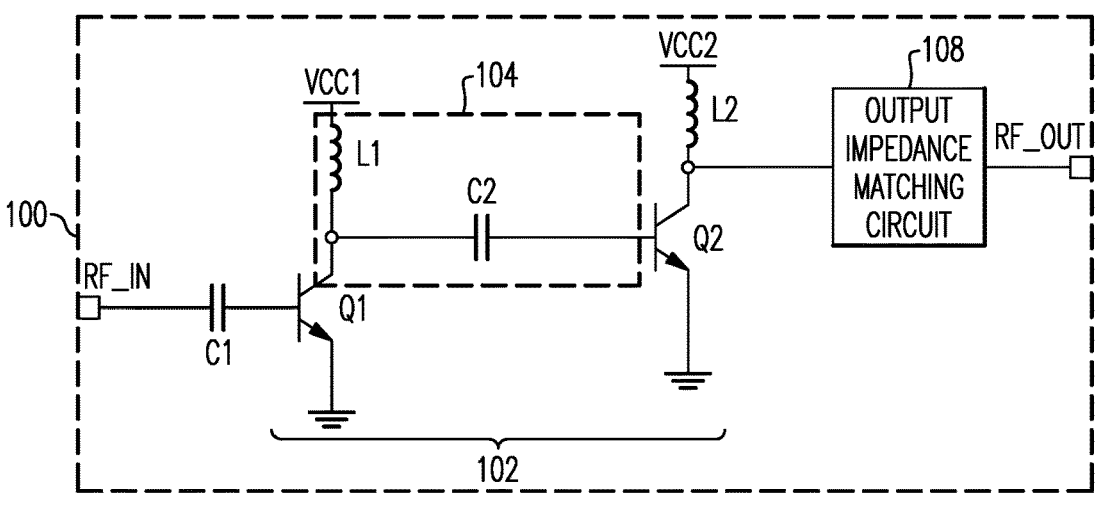
FIG. 6 shows an example where a power amplifier circuit
can include one or more VSWR management circuits con-
figured to provide one or more features as described herein.
Figure 7:
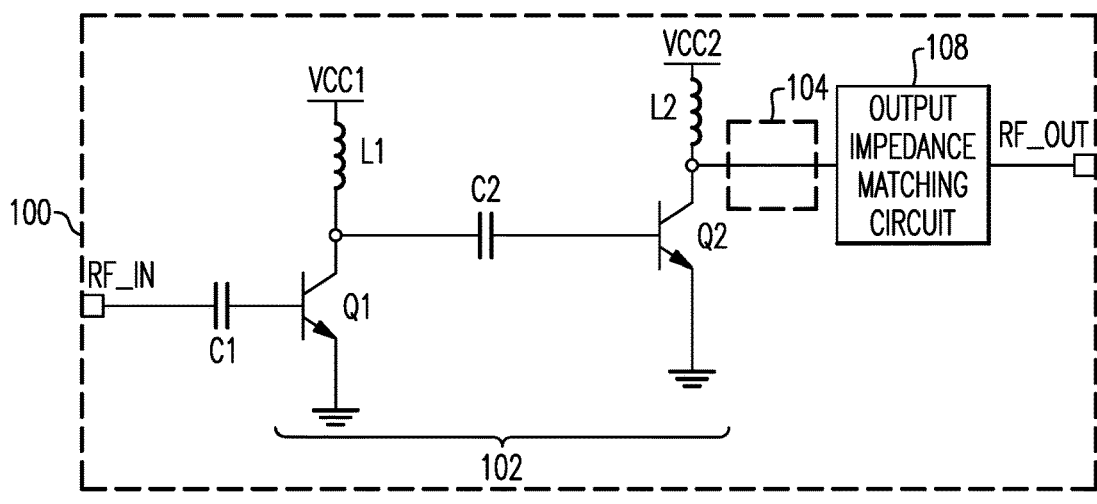
FIG. 7 shows another example where a power amplifier
circuit can include one or more VSWR management circuits
configured to provide one or more features as described
herein.
Figure 8:
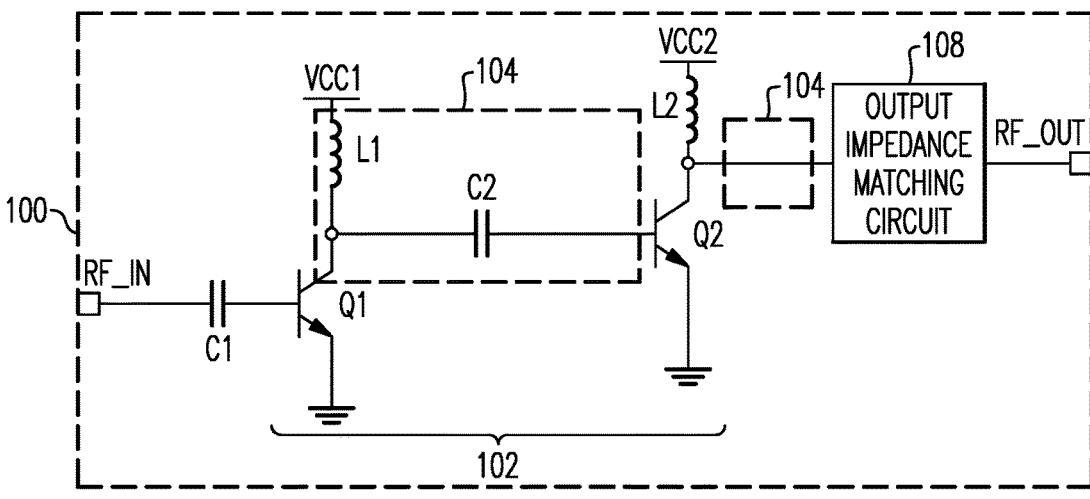
FIG. 8 shows yet another example where a power ampli-
fier circuit can include one or more VSWR management
circuits configured to provide one or more features as
described herein.

FIGS. 6-8 show that in some embodiments, a power amplifier circuit 100 can include one or more VSWR management circuits 104 configured to provide one or more features as described herein. For the purpose of description, each power amplifier circuit 100 in the examples of FIGS. 6-8 is shown to include a power amplifier 102 having a first stage (with a first amplifier transistor Q1) and a second stage (with a second amplifier transistor Q2) arranged between an input node RF_IN and an output node RF_OUT, similar to the example of FIG. 2. In such an example two-stage configuration, a VSWR management circuit 104 can be provided on the input side of the second amplifier transistor Q2 (as in the example of FIG. 6), or on the output side of the second amplifier transistor Q2 (as in the example of FIG. 7). As shown in the example of FIG. 8, VSWR management circuits 104 can be provided on both of the input side and output side of the second amplifier transistor Q2.

It will be understood that while various examples are described in the context of the foregoing two-stage configuration, one or more features of the present disclosure can also be implemented in power amplifier circuits having other numbers of stages. For example, a single-stage power amplifier can be provided with one or more VSWR management circuits implemented before and/or after its amplifier transistor. In another example, a power amplifier circuit may have more than two stages; and in such a configuration, the first and second amplifier transistors Q1, Q2 of FIGS. 6-8 can represent, for example, second-to-last and last stages, respectively.

Referring to the examples of FIGS. 6-8, in some embodiments, each of Q1 and Q2 can be a bipolar junction transistor (BJT), and the first transistor Q1 can receive the input signal at its base (e.g., from the input node RF_IN through a DC-block capacitance C1) and generate a partially amplified signal at its collector. The partially amplified signal from the collector of Q1 can be provided to the base of Q2 (e.g., through an inter-stage DC-block capacitance C2), and Q2 can generate the amplified signal at its collector. The amplified signal from the collector of Q2 can be provided to the output node RF_OUT through an output impedance matching circuit 108.

Referring to the examples of FIGS. 6-8, a supply voltage for the first amplifier transistor Q1 can be provided to the collector of Q1 (e.g., VCC1 through a choke inductance L1). Similarly, a supply voltage for the second amplifier transistor Q2 can be provided to the collector of Q2 (e.g., VCC2 through a choke inductance L2). The supply voltages VCC1 and VCC2 may or may not be the same. In the examples of FIGS. 6-8, although not shown, it will be understood that bias voltages can be provided to Q1 and Q2 through their respective bases.

FIG. 9 shows a power amplifier circuit 100 that is a more specific example of the power amplifier circuit 100 of FIG. 6. In the example of FIG. 9, a VSWR management circuit 104 (also indicated as 120) can include one or more circuits indicated as 104a, 104b, 104c. Examples of such circuits (104a, 104b, 104c) are described herein in greater detail.

In some embodiments, a first circuit 104a of the VSWR management circuit 120 in the power amplifier circuit 100 can include a resistance $R_{L1}$ implemented to be electrically parallel with the choke inductance L1 associated with the first amplifier transistor Q1. In the example context of Q1 being a bipolar junction transistor (BJT), the parallel combination of L1 and Ru can be implemented to be between the supply node VCC1 and the collector (110 in FIG. 9) of Q1. In some embodiments, the resistance $R_{L1}$ can be selected to, for example, reduce Q-factor for the choke inductance, and/or to reduce inter-stage loop gain for both half-harmonic frequencies and low frequency spurs.

In some embodiments, a second circuit 104b of the VSWR management circuit 120 in the power amplifier circuit 100 can be implemented as a series network provided between the collector (110 in FIG. 9) of Q1 and an input side (112 in FIG. 9) of the inter-stage DC-block capacitance C2.

FIG. 10A shows that in some embodiments, the second circuit 104b of FIG. 9 can be implemented as a series circuit 104b having an inter-stage inductance $L_{INT}$ and an inter-stage capacitance $C_{INT}$ arranged to be electrically in series, between the nodes 110 and 112. In some embodiments, $L_{INT}$ and $C_{INT}$ of such an inter-stage series circuit can be selected to provide a band-pass functionality and to reduce gain for low-frequency spurs (e.g., at frequencies below 200 MHz).

FIG. 10B shows that in some embodiments, the second circuit 104b of FIG. 9 can be implemented as a parallel circuit 104b having an inter-stage resistance $R_{INT}$ and an inter-stage capacitance $C_{INT}$ arranged to be electrically parallel, between the nodes 110 and 112. In some embodiments, $R_{INT}$ and $C_{INT}$ of such an inter-stage parallel circuit can be selected to provide a high-pass functionality and to reduce gain for low-frequency spurs (e.g., at frequencies below 200 MHz).

In some embodiments, a third circuit 104c of the VSWR management circuit 120 in the power amplifier circuit 100 can be implemented as a harmonic trap provided between an output side (114 in FIG. 9) of the inter-stage DC-block capacitance C2 and ground. It is noted that the node 114 in the example of FIG. 9 is also the base of the second amplifier transistor Q2.

FIG. 11A shows that in some embodiments, the third circuit 104c of FIG. 9 can be implemented as a harmonic trap circuit 104c having a resistance $R_{f0/2}$, an inductance $L_{f0/2}$ and a capacitance $C_{f0/2}$ arranged to be electrically in series, between the base 114 of Q2 and the ground. In some embodiments, $R_{f0/2}$, $L_{f0/2}$ and $C_{f0/2}$ of such a harmonic trap circuit can be selected to provide a notch functionality to the base 114 of Q2 to reduce or mitigate generation of oscillatory spurs at half-harmonic frequencies.

FIG. 11B shows that in some embodiments, the third circuit 104c of FIG. 9 can be implemented as a harmonic trap circuit 104c having a resistance $R_{f0/2}$ and an inductance $L_{f0/2}$ arranged to be electrically in series, between the base 114 of Q2 and the ground. In some embodiments, $R_{f0/2}$ and $L_{f0/2}$ of such a harmonic trap circuit can be selected to provide a low-frequency short functionality to the base 114 of Q2 to reduce or mitigate generation of oscillatory spurs at half-harmonic frequencies.

FIG. 12 shows a power amplifier circuit 100 that is a more specific example of the power amplifier circuit 100 of FIG. 7. In the example of FIG. 12, a VSWR management circuit 104 can include a VSWR limiting circuit 122 implemented between the output (116 in FIG. 12) of Q2 (e.g., collector of Q2) and ground, and configured to mitigate or reduce oscillatory spurs under high out-of-band VSWR conditions. Examples of such a limiting circuit are described herein in greater detail.

For example, FIG. 13A shows that in some embodiments, the VSWR limiting circuit 122 of FIG. 12 can be implemented as an all pass limiting circuit having a stabilizing resistance $R_{stab}$ implemented between the output 116 of Q2 and the ground. In some embodiments, such a VSWR limiting circuit (122) can be configured to limit VSWR across substantially the entire frequency range associated with operation of Q2.

In another example, FIG. 13B shows that in some embodiments, the VSWR limiting circuit 122 of FIG. 12 can be implemented as a notch limiting circuit having a stabilizing resistance $R_{stab}$, a stabilizing inductance $L_{stab}$ and a stabilizing capacitance $C_{stab}$, implemented in series between the output 116 of Q2 and the ground. In some embodiments, such a VSWR limiting circuit (122) can be configured to limit VSWR only at a notch frequency range associated with an out-of-band spur frequency.

In yet another example, FIG. 13C shows that in some embodiments, the VSWR limiting circuit 122 of FIG. 12 can be implemented as a low pass limiting circuit having a stabilizing resistance $R_{stab}$ and a stabilizing inductance $L_{stab}$, implemented in series between the output 116 of Q2 and the ground. In some embodiments, such a VSWR limiting circuit (122) can be configured to limit VSWR for frequencies below in-band frequencies (e.g., in-band transmit (Tx) frequencies).

In yet another example, FIG. 13D shows that in some embodiments, the VSWR limiting circuit 122 of FIG. 12 can be implemented as a high pass limiting circuit having a stabilizing resistance $R_{stab}$ and a stabilizing capacitance $C_{stab}$, implemented in series between the output 116 of Q2 and the ground. In some embodiments, such a VSWR limiting circuit (122) can be configured to limit VSWR for frequencies above in-band frequencies (e.g., in-band transmit (Tx) frequencies).

Figure 14:
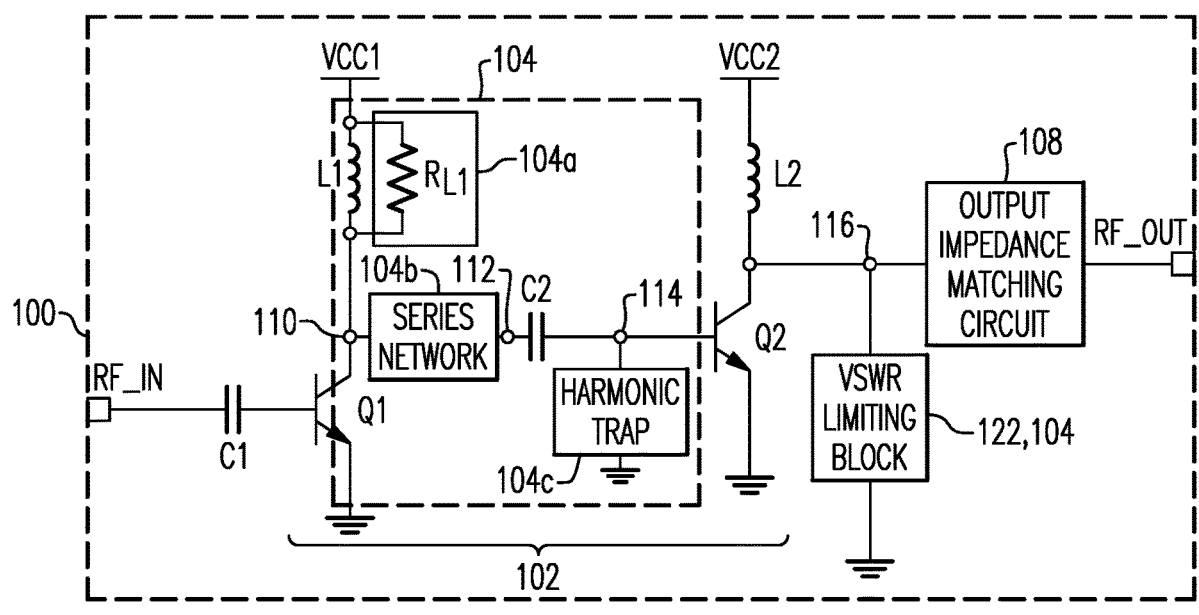
FIG. 14 shows a power amplifier circuit that is a more
specific example of the power amplifier circuit of FIG. 8.

FIG. 14 shows a power amplifier circuit 100 that is a more specific example of the power amplifier circuit 100 of FIG. 8. In the example of FIG. 12, VSWR management circuits 104 can include one or more circuits indicated as 104a, 104b, 104c, and a VSWR limiting circuit 122 implemented between the output 116 of Q2 (e.g., collector of Q2) and ground. In some embodiments, the one or more circuits 104a, 104b, 104c can be similar to the examples of FIGS. 9-11, and the VSWR limiting circuit 122 can be similar to the examples of FIGS. 12 and 13.

Figure 15:
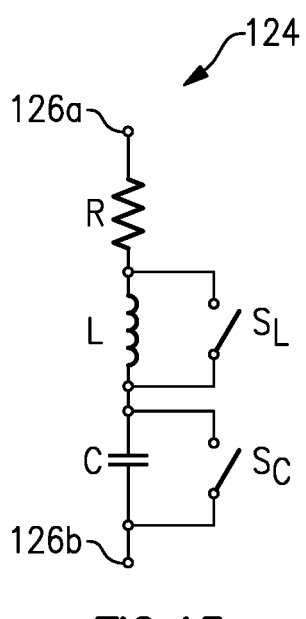
FIG. 15 shows that in some embodiments, a VSWR
management circuit having one or more features as
described herein can be implemented to provide a config-
urable functionality.

FIG. 15 shows that in some embodiments, a VSWR management circuit having one or more features as described herein can be implemented to provide a configurable functionality. For example, in FIG. 15, a configurable circuit 124 is shown to include a resistance R, an inductance L and a capacitance C arranged to be electrically in series between first and second nodes 126a, 126b. An inductance switch $S_L$ is shown to be provided to be electrically parallel with the inductance L, and a capacitance switch $S_C$ is shown to be provided to be electrically parallel with the capacitance C. Accordingly, the configurable circuit 124 can have different combinations of R, L and C, depending on the states of the switches $S_L$ and $S_C$.

For example, the configurable circuit 124 of FIG. 15 can be implemented to provide the example functionalities of the harmonic trap 104c described herein in reference to FIGS. 9 and 11. More particularly, the first and second nodes 126a, 126b of the configurable circuit 124 of FIG. 15 can correspond to the Q2's input node 114 and the ground of FIGS. 9 and 11, respectively. If both of the switches $S_L$ and $S_C$ are in an open state, the configurable circuit 124 provides an electrically series arrangement of R, L and C, and values of R, L and C can be selected to provide a functionality similar to the harmonic trap functionality of FIG. 11A. If the switch $S_L$ is in an open state and the switch $S_C$ is in a closed state, the configurable circuit 124 provides an electrically series arrangement of R and L (with C being bypassed), and values of R and L can be selected to provide a functionality similar to the harmonic trap functionality of FIG. 11B.

In another example, the configurable circuit 124 of FIG. 15 can be implemented to provide the example functionalities of the VSWR limiting block 122 described herein in reference to FIGS. 12 and 13. More particularly, the first and second nodes 126a, 126b of the configurable circuit 124 of FIG. 15 can correspond to the Q2's output node 116 and the ground of FIGS. 12 and 13, respectively. If both of the switches $S_L$ and $S_C$ are in a closed state, the configurable circuit 124 provides R, and value of R can be selected to provide a functionality similar to the VSWR limiting functionality of FIG. 13A. If both of the switches $S_L$ and $S_C$ are in an open state, the configurable circuit 124 provides an electrically series arrangement of R, L and C, and values of R, L and C can be selected to provide a functionality similar to the VWSR functionality of FIG. 13B. If the switch $S_L$ is in an open state and the switch $S_C$ is in a closed state, the configurable circuit 124 provides an electrically series arrangement of R and L (with C being bypassed), and values of R and L can be selected to provide a functionality similar to the VWSR limiting functionality of FIG. 13C. If the switch $S_L$ is in a closed state and the switch $S_C$ is in an open state, the configurable circuit 124 provides an electrically series arrangement of R and C (with L being bypassed), and values of R and C can be selected to provide a functionality similar to the VWSR limiting functionality of FIG. 13D.

It will be understood that in some embodiments, some or all of R, L, C, $S_L$ and $S_C$ can be configured to accommodate one or more effects (e.g., off-capacitance and on-resistance of the switches) resulting from the presence of the switches.

Figure 16:
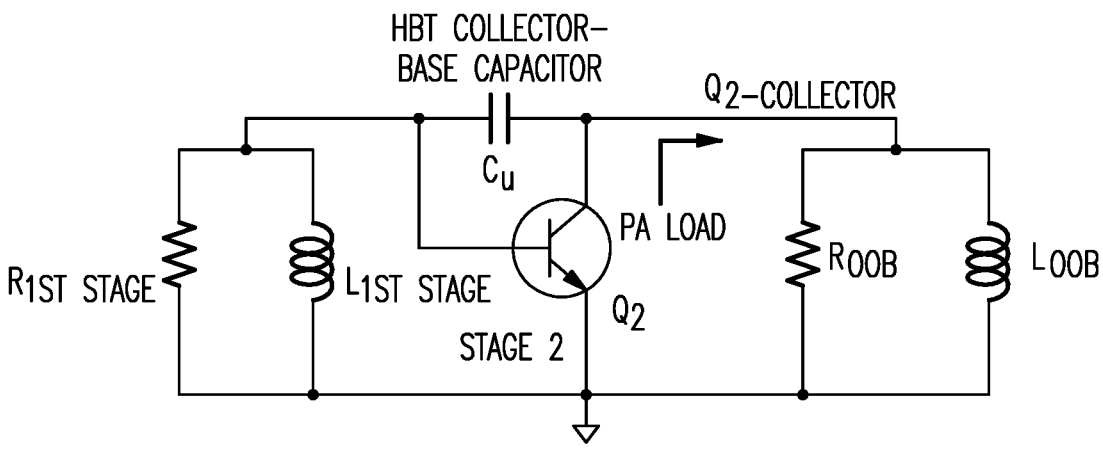
FIG. 16 shows an equivalent model of a two-stage power
amplifier circuit similar to the power amplifier circuit of
FIG. 5.

FIGS. 16-23 show various examples of how some or all of the VSWR limiting block (122, 104) of, for example, FIG. 12 can be designed. FIG. 16 shows an equivalent model of a two-stage power amplifier circuit similar to the power amplifier circuit 10 of FIG. 5, where out-of-band spurs along with Hartley oscillatory conditions can be present. FIG. 17 shows impedance plots of a load seen by the power amplifier (PA load) under a 50-Ohm load condition (upper left and lower left panels), and impedance plots of a load seen by the power amplifier (PA load) under a high out-of-band VSWR condition (upper right and lower right panels). In the high out-of-band VSWR condition (upper right and lower right panels), one can see a resonance at approximately 1.65 GHz (spur frequency), causing gain peaking and oscillatory spurs.

Figure 18:
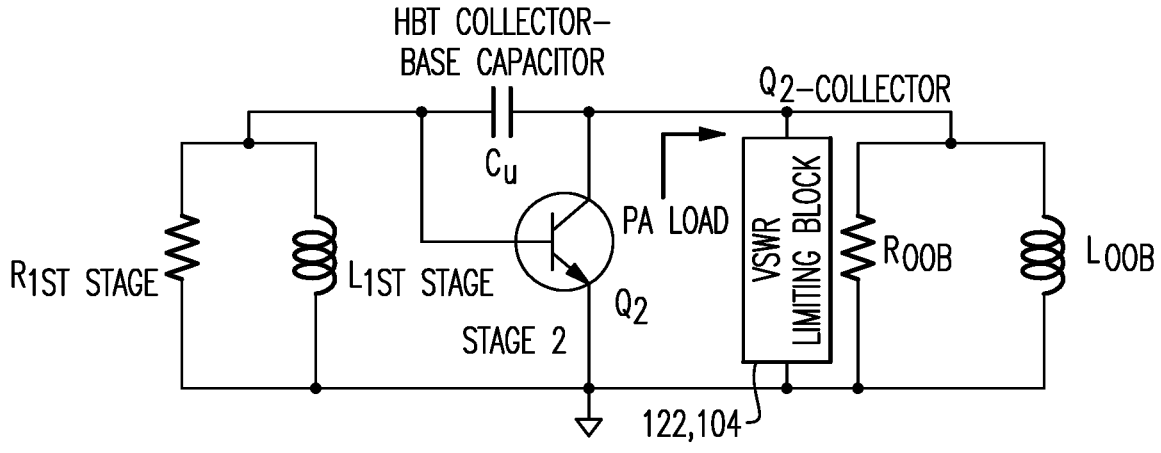
FIG. 18 shows that in some embodiments, a VSWR
limiting block having one or more features as described
herein can be introduced to the two-stage power amplifier
circuit model of FIG. 16.

FIG. 18 shows that in some embodiments, a VSWR limiting block 122, 104 having one or more features as described herein can be introduced to the two-stage power amplifier circuit model of FIG. 16. As described herein, such a VSWR limiting block can reduce or mitigate impact of high out-of-band VSWR arising from, for example, a front-end filter. For the purpose of description, the two-stage power amplifier circuit model of FIG. 18 can correspond to the example configuration of FIG. 12.

Figure 19:
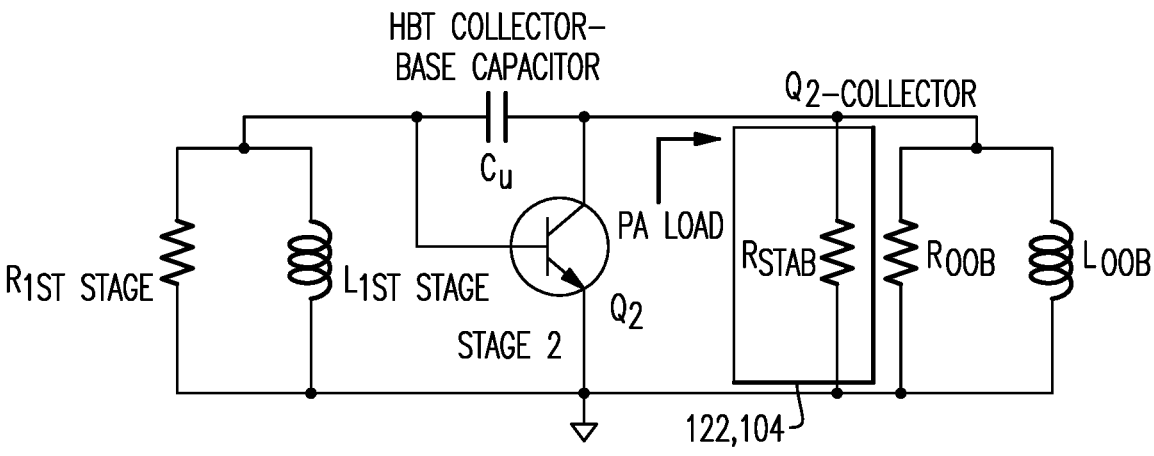
FIG. 19 shows an example where the VSWR limiting
block of the two-stage power amplifier circuit model of FIG.
18 includes a stabilizing resistance.
Figure 20:
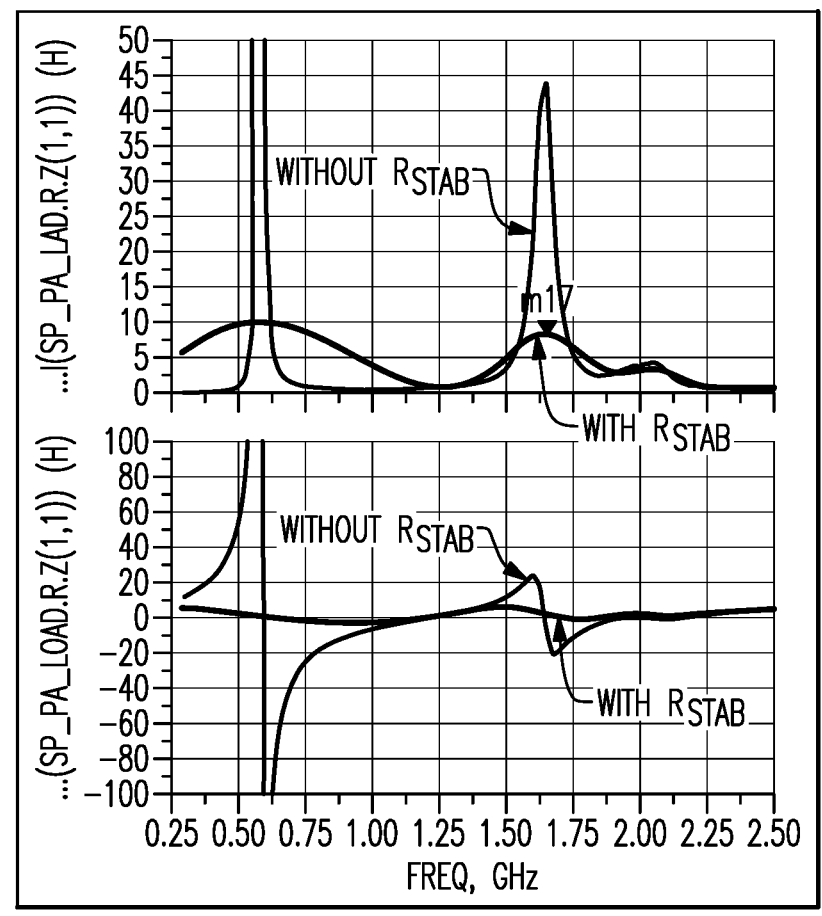
FIG. 20 shows impedance plots of a load seen by the
power amplifier of FIG. 19 under a high out-of-band VSWR
condition.

FIG. 19 shows an example where the VSWR limiting block 122, 104 of the two-stage power amplifier circuit model of FIG. 18 includes a stabilizing resistance $R_{stab}$, similar to the example of FIG. 13A. FIG. 20 shows impedance plots of a load seen by the power amplifier (PA load) under a high out-of-band VSWR condition. One can see that the presence of the stabilizing resistance $R_{stab}$ limits the PA load peaking under the high VSWR condition, including attenuation of the oscillatory gain condition and removal or reduction of out-of-band spurs at approximately 1.65 GHz.

It is noted that in some embodiments, a value for the stabilizing resistance $R_{stab}$ can be selected to be larger than a PA load-line under 50-Ohm condition, but smaller than a PA load under an out-of-band VSWR condition. With such a selection of $R_{stab}$, minimal or reduced impact on 50-Ohm operation can be observed.

Figure 21:
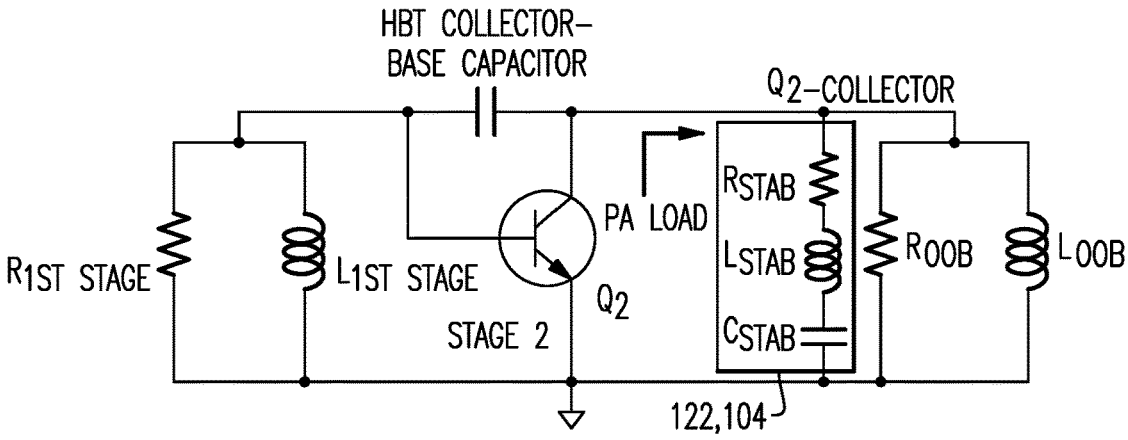
FIG. 21 shows an example where the VSWR limiting
block of the two-stage power amplifier circuit model of FIG.
18 includes a stabilizing resistance, a stabilizing inductance
and a stabilizing capacitance.
Figure 22:
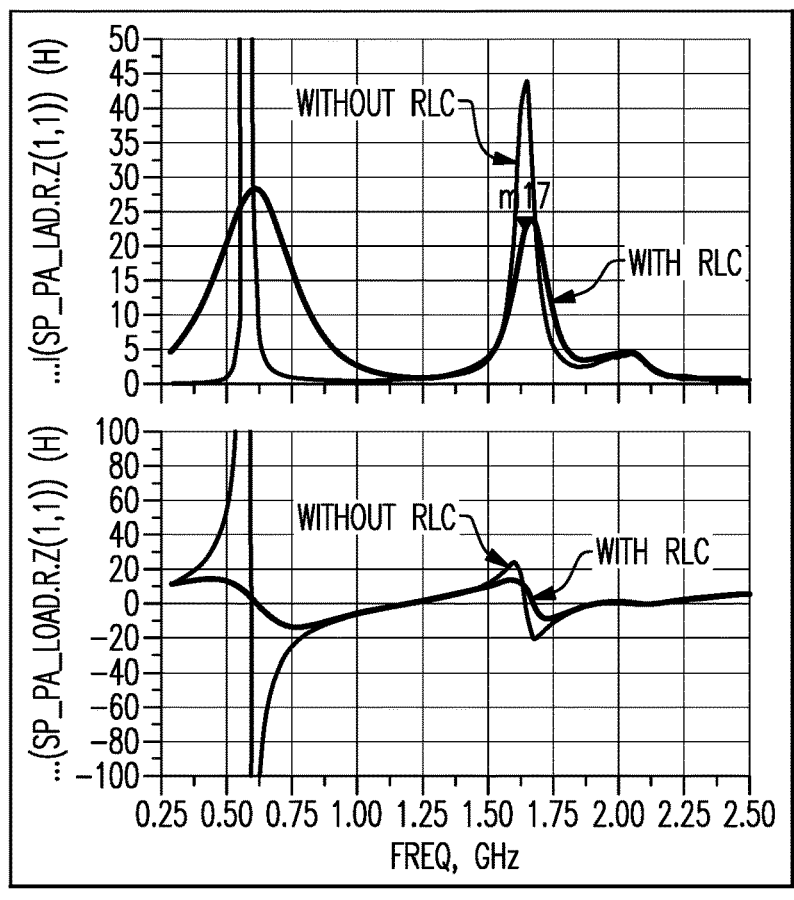
FIG. 22 shows impedance plots of a load seen by the
power amplifier of FIG. 21 under a high out-of-band VSWR
condition.

FIG. 21 shows an example where the VSWR limiting block 122, 104 of the two-stage power amplifier circuit model of FIG. 18 includes a stabilizing resistance $R_{stab}$, a stabilizing inductance $L_{stab}$ and a stabilizing capacitance $C_{stab}$, similar to the example of FIG. 13B. FIG. 22 shows impedance plots of a load seen by the power amplifier (PA load) under a high out-of-band VSWR condition. One can see that the presence of the stabilizing RLC circuit limits the VSWR only at the out-of-band spur frequency, thus attenuating the oscillatory conditions only at the spur frequency. It is also noted that reduced peaking is observed in the PA load under high out-of-band VSWR condition by using the stabilizing RLC circuit. Since such an RLC circuit is frequency selective, it can be configured to present an open-circuit, or approximately an open-circuit, at in-band frequencies and not impact in-band power amplifier performance.

Figure 23:
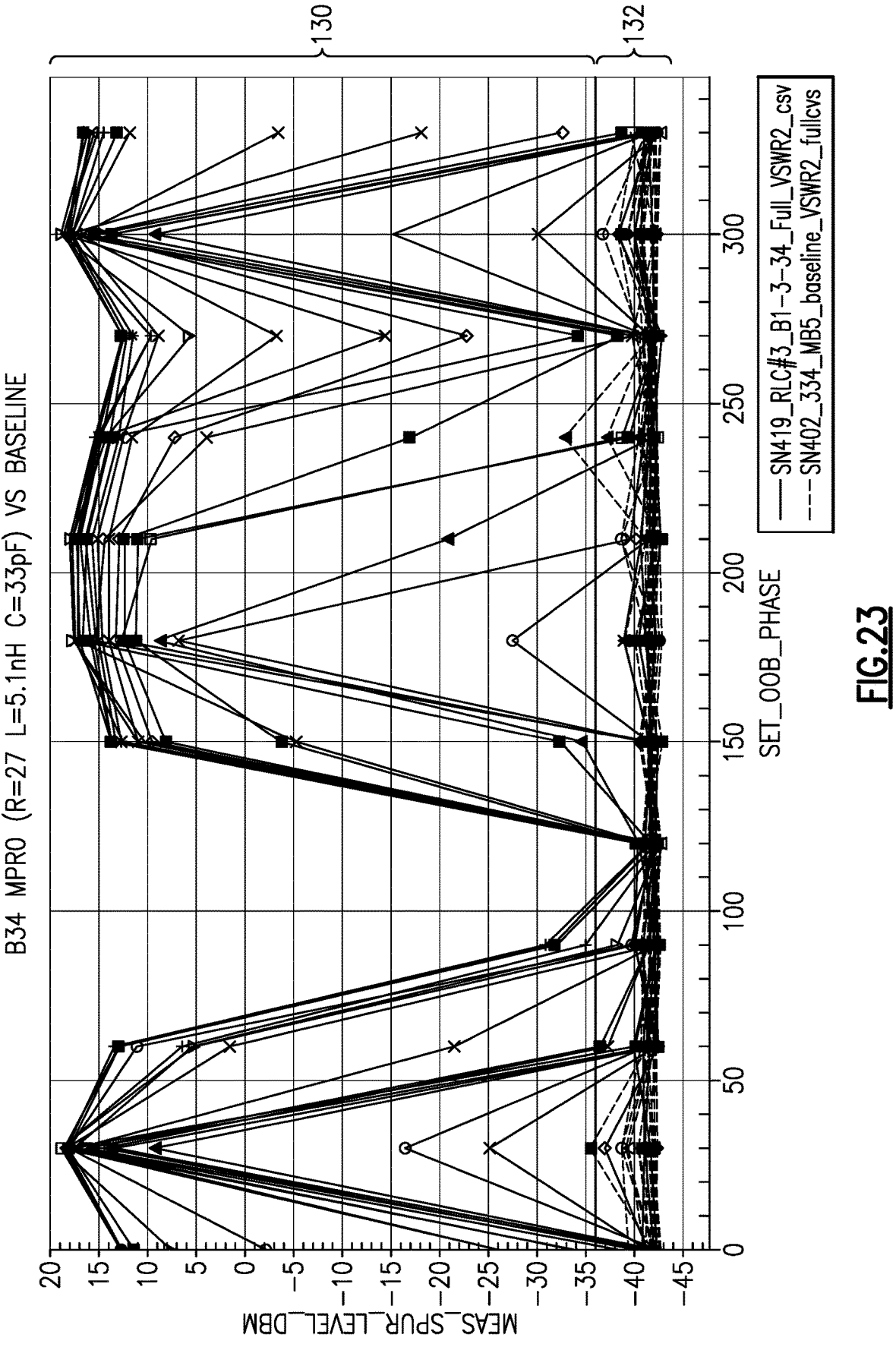
FIG. 23 shows examples of measurements of spur levels
at 1.65 GHz under 2:1 in-band VSWR and 10:1 out-of-band
VSWR conditions.

For example, FIG. 23 shows measurements of spur levels at 1.65 GHz under 2:1 in-band VSWR and 10:1 out-of-band VSWR conditions. High spur levels generally in the region 130 are associated with the configuration of FIG. 16 (without VSWR limiting block). Measured levels generally in the region 132 with little or no oscillatory spurs at almost all in-band/out-of-band phase combinations correspond to the example VSWR limiting configuration of FIG. 21.

Figure 24A:
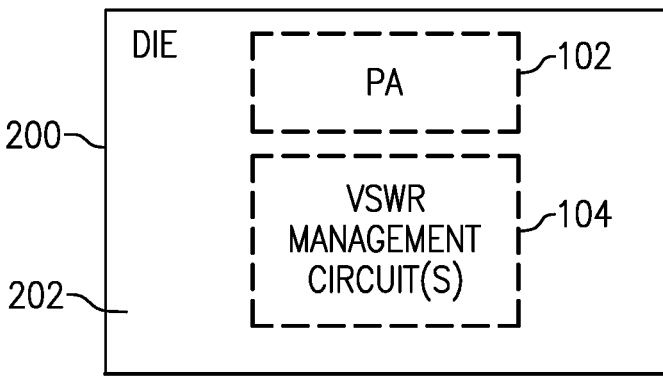
FIG. 24A shows that in some embodiments, a semicon-
ductor die can include substantially all of VSWR manage-
ment circuit(s) having one or more features as described
herein.
Figure 24B:
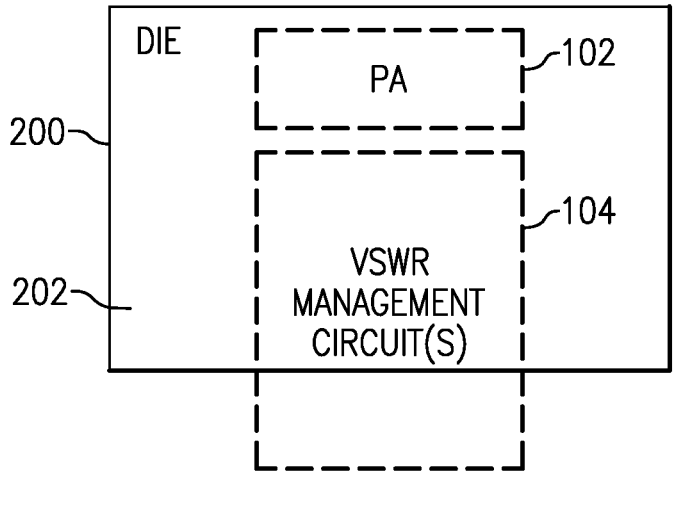
FIG. 24B shows that in some embodiments, some of
VSWR management circuit(s) having one or more features
as described herein can be implemented on a semiconductor
die that also includes a power amplifier, and the remaining
portion of the VSWR management circuit(s) can be imple-
mented off of the die.
Figure 24C:
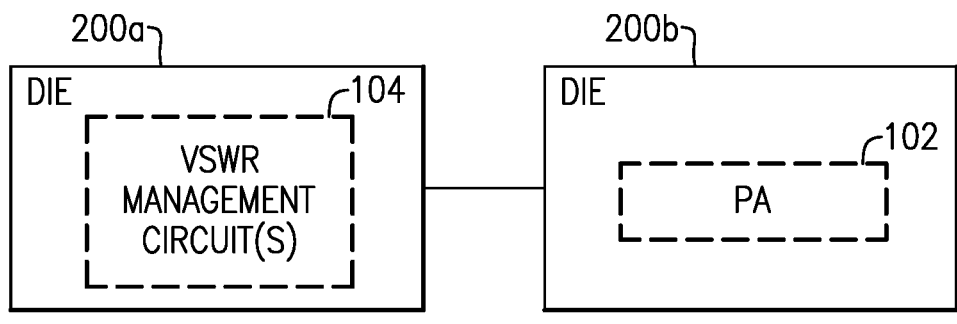
FIG. 24C shows that in some embodiments, a power
amplifier having one or more features as described herein
can be implemented on one semiconductor die, and VSWR
management circuit(s) having one or more features as
described herein can be implemented on another semicon-
ductor die.
Figure 25:
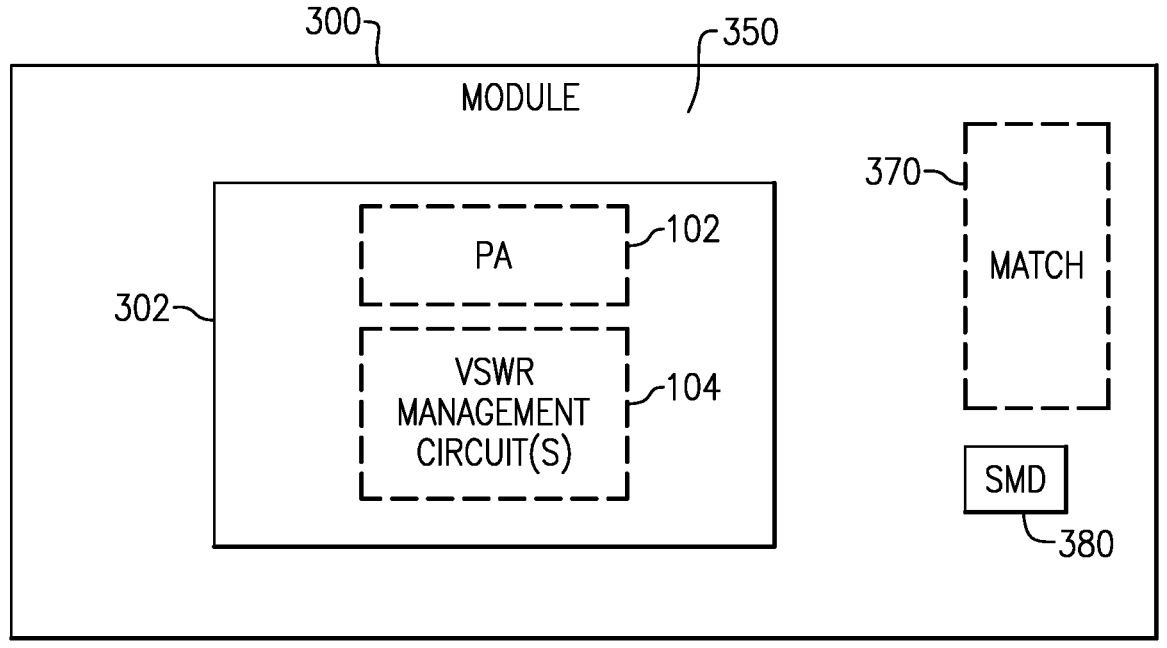
FIG. 25 schematically depicts an example module that
can be configured to include one or more VSWR manage-
ment circuits having one or more features as described
herein.
Figure 26:
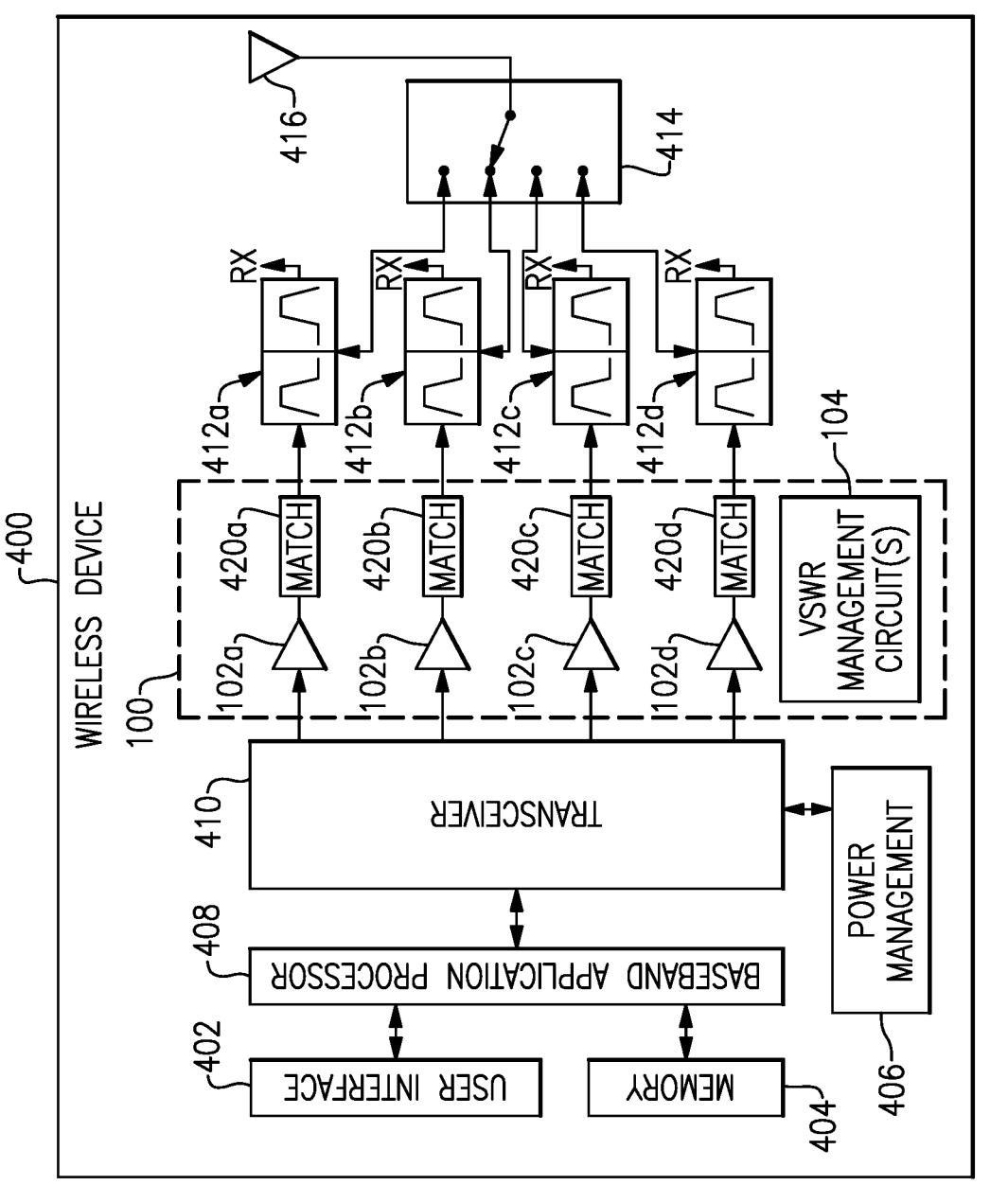
FIG. 26 schematically depicts an example wireless device
having one or more advantageous features described herein.

In some embodiments, a VSWR management circuit having one or more features as described herein can be implemented in different products. FIGS. 24-26 show non-limiting examples of such products. FIGS. 24A-24C show various examples of how one or more VSWR management circuits 104 can be implemented at a die level. FIG. 25 shows an example of how one or more VSWR management circuits 104 can be implemented in a module such as a packaged module. FIG. 26 shows an example of how one or more VSWR management circuits 104 can be implemented in a wireless device.

FIGS. 24A-24C show that one or more VSWR management circuits 104 having one or more features as described herein can be implemented on one or more die. FIG. 24A shows that in some embodiments, substantially all of one or more VSWR management circuits 104 can be formed on a semiconductor substrate 202 of a die 200 that also includes a power amplifier 102.

FIG. 24B shows that in some embodiments, some of one or more VSWR management circuits 104 can be formed on a semiconductor substrate 202 of a die 200 that also includes a power amplifier 102, and the remaining portion of the one or more VSWR management circuits 104 can be implemented off of the die 200. Such an off-die portion of the one or more VSWR management circuits 104 may be implemented on a substrate where the die 200 is mounted, on a separate die, or any combination thereof. In some embodiments, the die 200 of FIGS. 24A and 24B can include, for example, an HBT die based on gallium arsenide (GaAs) substrate.

FIG. 24C shows that in some embodiments, a power amplifier 102 having one or more features as described herein can be implemented on one die 200b, and one or more VSWR management circuits 104 having one or more features as described herein can be implemented on another die 200a. In some embodiments, at least the die 200b can include, for example, an HBT die based on gallium arsenide (GaAs) substrate.

FIG. 25 schematically depicts an example module 300 that can be configured to include one or more VSWR management circuits 104 having one or more features as described herein. In FIG. 25, the example module 300 is shown to include a power amplifier die 302 that includes a power amplifier 102. In the example of FIG. 25, one or more VSWR management circuits 104 are depicted as being implemented on the same die 302. However, it will be understood that the power amplifier 102 and the one or more VSWR management circuits 104 can be configured in other manners, such as the examples described in reference to FIGS. 24B and 24C.

In the example module 300 of FIG. 25, the die 302 is shown to be mounted on a substrate 350. In some embodiments, such a packaging substrate can be configured to receive a plurality of components such as the die 302 and one or more SMDs (e.g., 380) and/or one or more circuits (e.g., matching circuit 370). In some embodiments, the packaging substrate 350 can include a laminate substrate.

In some embodiments, the module 300 can also include one or more packaging structures to, for example, provide protection and facilitate easier handling of the module 300. Such a packaging structure can include an overmold formed over the packaging substrate 350 and dimensioned to substantially encapsulate the various circuits and components thereon.

In some implementations, a device and/or a circuit having one or more features described herein can be included in an RF device such as a wireless device. Such a device and/or a circuit can be implemented directly in the wireless device, in a modular form as described herein, or in some combination thereof. In some embodiments, such a wireless device can include, for example, a cellular phone, a smart-phone, a hand-held wireless device with or without phone functionality, a wireless tablet, etc.

FIG. 26 schematically depicts an example wireless device 400 having one or more advantageous features described herein. In the example, one or more power amplifiers 102 are shown to be parts of a power amplifier circuit 100 having one or more features as described herein. Such a power amplifier circuit can include one or more matching circuits 420 and one or more VSWR management circuits 104.

The power amplifiers 102 can receive their respective RF signals from a transceiver 410 that can be configured and operated to generate RF signals to be amplified and transmitted, and to process received signals. The transceiver 410 is shown to interact with a baseband sub-system 408 that is configured to provide conversion between data and/or voice signals suitable for a user and RF signals suitable for the transceiver 410. The transceiver 410 is also shown to be connected to a power management component 406 that is configured to manage power for the operation of the wireless device 400. Such power management can also control operations of the baseband sub-system 408 and the power amplifiers 102.

The baseband sub-system 408 is shown to be connected to a user interface 402 to facilitate various input and output of voice and/or data provided to and received from the user. The baseband sub-system 408 can also be connected to a memory 404 that is configured to store data and/or instructions to facilitate the operation of the wireless device 400, and/or to provide storage of information for the user.

In the example wireless device 400, outputs of the power amplifiers 102 are shown to be matched (via match circuits 420) and routed to an antenna 416 via their respective duplexers 412a-412d and a band-selection switch 414. The band-selection switch 414 can be configured to allow selection of an operating band. In some embodiments, each duplexer 412 can allow transmit and receive operations to be performed simultaneously using a common antenna (e.g., 416). In FIG. 26, received signals are shown to be routed to "Rx" paths (not shown) that can include, for example, a low-noise amplifier (LNA).

A number of other wireless device configurations can utilize one or more features described herein. For example, a wireless device does not need to be a multi-band device. In another example, a wireless device can include additional antennas such as diversity antenna, and additional connectivity features such as Wi-Fi, Bluetooth, and GPS.

Unless the context clearly requires otherwise, throughout the description and the claims, the words "comprise," "comprising," and the like are to be construed in an inclusive sense, as opposed to an exclusive or exhaustive sense; that is to say, in the sense of "including, but not limited to." The word "coupled", as generally used herein, refers to two or more elements that may be either directly connected, or connected by way of one or more intermediate elements. Additionally, the words "herein," "above," "below," and words of similar import, when used in this application, shall refer to this application as a whole and not to any particular portions of this application. Where the context permits, words in the above Description using the singular or plural number may also include the plural or singular number respectively. The word "or" in reference to a list of two or more items, that word covers all of the following interpretations of the word: any of the items in the list, all of the items in the list, and any combination of the items in the list.

The above detailed description of embodiments of the invention is not intended to be exhaustive or to limit the invention to the precise form disclosed above. While specific embodiments of, and examples for, the invention are described above for illustrative purposes, various equivalent modifications are possible within the scope of the invention, as those skilled in the relevant art will recognize. For example, while processes or blocks are presented in a given order, alternative embodiments may perform routines having steps, or employ systems having blocks, in a different order, and some processes or blocks may be deleted, moved, added, subdivided, combined, and/or modified. Each of these processes or blocks may be implemented in a variety of different ways. Also, while processes or blocks are at times shown as being performed in series, these processes or blocks may instead be performed in parallel, or may be performed at different times.

The teachings of the invention provided herein can be applied to other systems, not necessarily the system described above. The elements and acts of the various embodiments described above can be combined to provide further embodiments.

While some embodiments of the inventions have been described, these embodiments have been presented by way of example only, and are not intended to limit the scope of the disclosure. Indeed, the novel methods and systems described herein may be embodied in a variety of other forms; furthermore, various omissions, substitutions and changes in the form of the methods and systems described herein may be made without departing from the spirit of the disclosure. The accompanying claims and their equivalents are intended to cover such forms or modifications as would fall within the scope and spirit of the disclosure.

What is claimed is:

1. An amplifier circuit comprising:
an amplifier having a first stage and a second stage, each stage including an input and an output, such that the output of the first stage is coupled to the input of the second stage, the second stage being an output stage and the first stage being a stage immediately preceding the output stage; and
a stabilizing circuit implemented on the input side of the second stage and configured to provide stability in operation of the amplifier under a high in-band voltage standing wave ratio condition.

2. An amplifier circuit comprising:
an amplifier having a first stage and a second stage, each stage including an input and an output, such that the output of the first stage is coupled to the input of the second stage, the first stage including a first amplifier transistor, and the second stage including a second amplifier transistor, such that the output of the first amplifier transistor is coupled to the input of the second amplifier transistor, each of the first and second amplifier transistors implemented as a bipolar-junction transistor having a base as the input and a collector as the output; and
a stabilizing circuit implemented on the input side of the second stage and configured to provide stability in operation of the amplifier under a high in-band voltage standing wave ratio condition, the stabilizing circuit including one or more of a harmonic trap coupled to the base of the second amplifier transistor, a spur-reduction network implemented between the first and second amplifier transistors, and a resistance implemented to be electrically parallel with a choke inductance that couples the collector of the first amplifier transistor to a supply voltage node.

3. The amplifier circuit of claim 2 wherein the harmonic trap is configured to reduce generation of one or more oscillatory spurs at one or more harmonic frequencies.

4. The amplifier circuit of claim 3 wherein the one or more harmonic frequencies include one or more half-harmonic frequencies.

5. The amplifier circuit of claim 4 wherein the harmonic trap includes a half-harmonic notch circuit having a resistance, an inductance, and a capacitance arranged in electrical series between the base of the second amplifier transistor and ground.

6. The amplifier circuit of claim 4 wherein the harmonic trap includes a resistance and an inductance arranged in electrical series between the base of the second amplifier transistor and ground, the resistance and the inductance selected to provide a low-frequency short functionality.

7. The amplifier circuit of claim 2 wherein the spur-reduction network is configured to reduce gain of one or more low-frequency spurs.

8. The amplifier circuit of claim 7 wherein the spur-reduction network includes an inductance and a capacitance arranged in electrical series between the collector of the first amplifier transistor and an inter-stage DC-block capacitance, the inductance and the capacitance selected to provide a band-pass functionality.

9. The amplifier circuit of claim 7 wherein the spur-reduction network includes a resistance and a capacitance arranged to be electrically parallel between the collector of the first amplifier transistor and an inter-stage DC-block capacitance, the inductance and the capacitance selected to provide a high-pass functionality.

10. The amplifier circuit of claim 2 wherein the resistance is selected to reduce an inter-stage loop gain for one or more harmonics and one or more low-frequency spurs.

11. The amplifier circuit of claim 1 wherein the amplifier is a power amplifier.

12. A semiconductor die comprising:
a semiconductor substrate; and
an amplifier circuit implemented on the semiconductor substrate, the amplifier circuit including an amplifier having a first stage and a second stage, each stage including an input and an output, such that the output of the first stage is coupled to the input of the second stage, the second stage being an output stage and the first stage being a stage immediately preceding the output stage, the amplifier circuit further including a stabilizing circuit implemented on the input side of the second stage and configured to provide stability in operation of the amplifier under a high in-band voltage standing wave ratio condition.

13. The semiconductor die of claim 12 wherein the amplifier is a power amplifier.

14. A packaged module comprising:
a packaging substrate configured to receive a plurality of components; and
an amplifier circuit implemented on the packaging substrate, the amplifier circuit including an amplifier having a first stage and a second stage, each stage including an input and an output, such that the output of the first stage is coupled to the input of the second stage, the second stage being an output stage and the first stage being a stage immediately preceding the output stage, the amplifier circuit further including a stabilizing circuit implemented on the input side of the second stage and configured to provide stability in operation of the amplifier under a high in-band voltage standing wave ratio condition.

15. The packaged module of claim 14 wherein the amplifier is a power amplifier.

16. The packaged module of claim 15 further comprising an output impedance matching network coupled to the output of the second stage.

\* \* \* \* \*